(12) United States Patent
Richter et al.

(10) Patent No.: US 10,608,146 B2
(45) Date of Patent: Mar. 31, 2020

(54) PRODUCTION OF RADIATION-EMITTING COMPONENTS

(71) Applicant: OSRAM OLED GmbH, Regensburg (DE)

(72) Inventors: Markus Richter, Burglengenfeld (DE); Tamas Lamfalusi, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/911,407

(22) Filed: Mar. 5, 2018

(65) Prior Publication Data
US 2018/0261732 A1    Sep. 13, 2018

(30) Foreign Application Priority Data

Mar. 9, 2017    (DE) .......................... 10 2017 105 017

(51) Int. Cl.
| | |
|---|---|
| *H01L 33/48* | (2010.01) |
| *H01L 33/62* | (2010.01) |
| *H01L 33/60* | (2010.01) |
| *H01L 33/64* | (2010.01) |
| *H01L 25/075* | (2006.01) |

(52) U.S. Cl.
CPC .......... *H01L 33/486* (2013.01); *H01L 33/60* (2013.01); *H01L 33/62* (2013.01); *H01L 33/647* (2013.01); *H01L 25/0753* (2013.01); *H01L 2933/0033* (2013.01); *H01L 2933/0058* (2013.01); *H01L 2933/0066* (2013.01); *H01L 2933/0075* (2013.01)

(58) Field of Classification Search
CPC ..... H01L 2224/32245; H01L 2924/181; H01L 33/486; H01L 2924/12041; H01L 33/62
See application file for complete search history.

(56) References Cited

U.S. PATENT DOCUMENTS

| | | | | |
|---|---|---|---|---|
| 2010/0006994 | A1* | 1/2010 | Shim | ..................... H01L 21/561 |
| | | | | 257/676 |
| 2013/0126935 | A1* | 5/2013 | Zitzlsperger | .......... H01L 33/486 |
| | | | | 257/99 |
| 2014/0042488 | A1* | 2/2014 | Fujitomo | .......... H01L 31/02002 |
| | | | | 257/99 |

FOREIGN PATENT DOCUMENTS

| | | |
|---|---|---|
| DE | 10 2012 109 905 A1 | 4/2014 |
| DE | 10 2015 109 953 A1 | 12/2016 |

\* cited by examiner

*Primary Examiner* — Jaehwan Oh
(74) *Attorney, Agent, or Firm* — DLA Piper LLP (US)

(57) ABSTRACT

A method includes providing a metallic auxiliary carrier and forming metallic structure elements on the auxiliary carrier by carrying out at least one metal deposition process with the aid of at least one masking layer. Provision is furthermore made for arranging a reflective embedding material enclosing the metallic structure elements on the auxiliary carrier and removing the auxiliary carrier, such that a carrier comprising the structure elements and the embedding material and comprising two opposite main sides is provided. The main sides of the carrier are formed by the structure elements and the embedding material. The method furthermore includes arranging radiation-emitting semiconductor chips on the carrier, arranging a conversion material for radiation conversion on the carrier provided with the semiconductor chips, and carrying out a singulation process of forming separate radiation-emitting components.

13 Claims, 23 Drawing Sheets

_US 10,608,146 B2_

PRODUCTION OF RADIATION-EMITTING COMPONENTS

TECHNICAL FIELD

This disclosure relates to a method of producing radiation-emitting components and a radiation-emitting component.

BACKGROUND

Components comprising one or more radiation-emitting semiconductor chips are increasingly being used nowadays in the field of general lighting. Components comprising sapphire chips have become established on account of technical and economic market requirements. These are LED (Light Emitting Diode) chips comprising a radiation-transmissive chip substrate comprising sapphire, which chips may emit a light radiation in all directions. On account of this property, the surface constitution of carrier substrates of the semiconductor chips is of crucial importance. The substrates are intended to comprise a high reflectivity and long-term stability vis-à-vis the high-energy radiation of the semiconductor chips (blue light radiation or UV radiation).

Conventional radiation-emitting components comprise leadframe-based carrier substrates. Substrates of this type comprise a metallic leadframe that may be provided with a reflective metallic coating. A silver coating is possible, for example, although it is susceptible to corrosion. Therefore, leadframe-based substrates comprising a gold-palladium coating are generally used. Although such substrates are more expensive, less reflective and more demanding in the LED production chain, they are preferred to the silver-coated substrates on account of the corrosion of silver.

It could therefore be helpful to provide an improved method of producing radiation-emitting components and an improved radiation-emitting component.

SUMMARY

We provide a method of producing radiation-emitting components including providing a metallic auxiliary carrier; forming metallic structure elements on the auxiliary carrier by carrying out at least one metal deposition process with the aid of at least one masking layer; arranging a reflective embedding material enclosing the metallic structure elements on the auxiliary carrier and removing the auxiliary carrier such that a carrier including the structure elements and the embedding material and including two opposite main sides is provided, wherein main sides of the carrier are formed by the structure elements and the embedding material; arranging radiation-emitting semiconductor chips on the carrier; arranging a conversion material for radiation conversion on the carrier provided with the semiconductor chips; and carrying out a singulation process of forming separate radiation-emitting components.

We also provide a radiation-emitting component including a carrier including two opposite main sides, wherein the carrier includes metallic structure elements and a reflective embedding material enclosing the structure elements, and the main sides of the carrier are formed by the structure elements and the embedding material; at least one radiation-emitting semiconductor chip arranged on the carrier; and a conversion material for radiation conversion, the conversion material covering the at least one semiconductor chip.

LIST OF REFERENCE SIGNS

Figure 1:
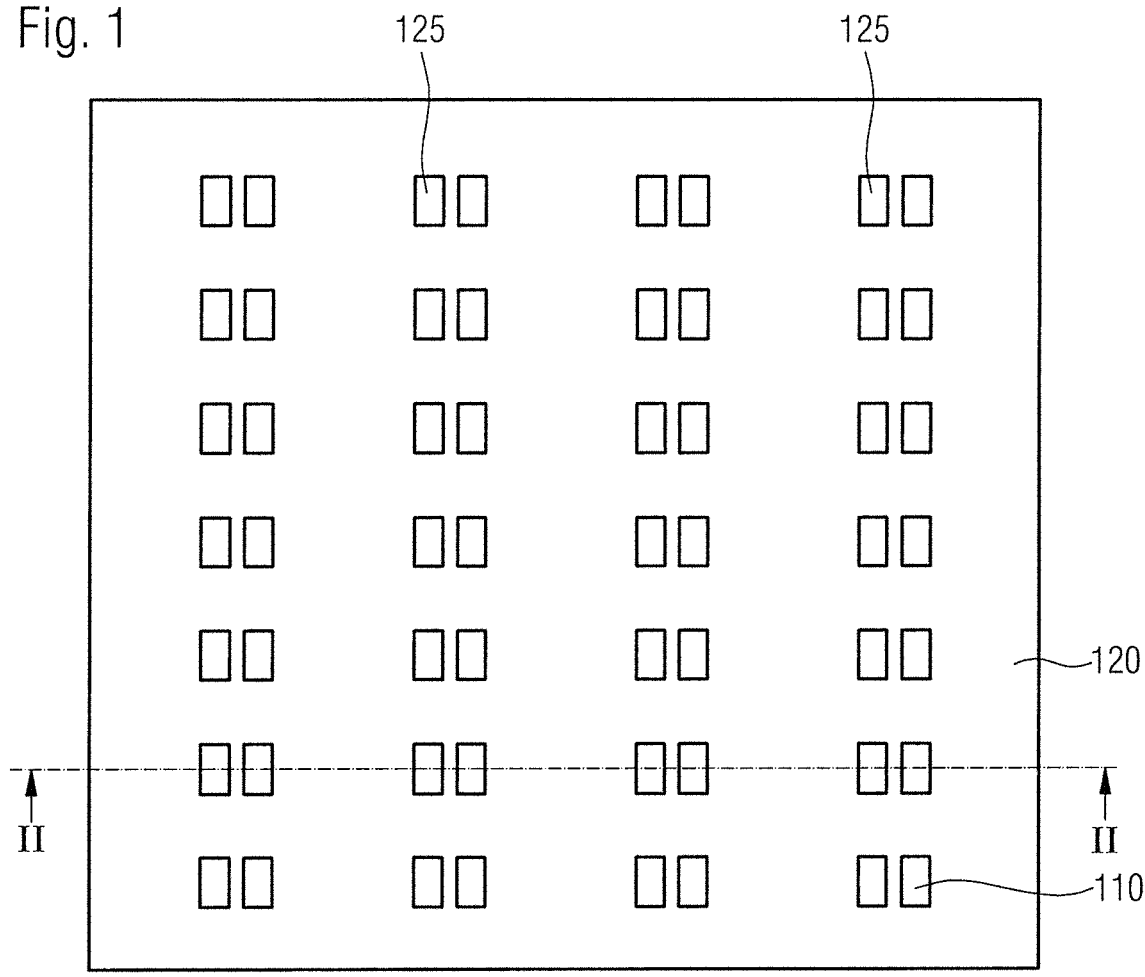
FIGS. 1 to 19 schematically show a method sequence of producing radiation-emitting components on the basis of plan view illustrations and lateral sectional illustrations, wherein, by carrying out metal deposition processes, metallic structure elements are formed on a metallic auxiliary carrier, a reflective embedding material is arranged on the auxiliary carrier and the auxiliary carrier is removed such that a carrier is provided, radiation-emitting semiconductor chips are arranged on the carrier and electrically connected to structure elements of the carrier using an electrically conductive connection material, a conversion material covering the semiconductor chips is arranged on the carrier, and singulation into single-chip components is carried out.

100 Component
110 Auxiliary carrier
120 Masking layer
121 Masking layer
122 Masking layer
125 Opening
130 Structure element
131 Structure element
132 Structure element
133 Connection web
135 Section
136 Section
140 Embedding material
145 Layer
150 Carrier
151 Main side
152 Main side
160 Semiconductor chip
165 Semiconductor chip
170 Connection material
175 Bond wire
180 Conversion material
190 Separating line
231 Noble metal
232 Metal

DETAILED DESCRIPTION

We provide a method of producing radiation-emitting components. The method comprises providing a metallic auxiliary carrier and forming metallic structure elements on the auxiliary carrier by carrying out at least one metal deposition process with the aid of at least one masking layer. Provision is furthermore made for arranging a reflective embedding material enclosing the metallic structure elements on the auxiliary carrier and removing the auxiliary carrier such that a carrier comprising the structure elements and the embedding material and comprising two opposite main sides is provided. The main sides of the carrier are formed by the structure elements and the embedding material. The method furthermore comprises arranging radiation-emitting semiconductor chips on the carrier, arranging a conversion material for radiation conversion on the carrier provided with the semiconductor chips, and carrying out a singulation process of forming separate radiation-emitting components.

The method involves providing a carrier comprising a reflective embedding material and metallic structure elements embedded therein. At least one portion of the metallic structure elements may serve as electrical conductor structures of the carrier. The carrier furthermore comprises two opposite main sides. The latter are sides of the carrier comprising the largest lateral extent. The main sides of the carrier that may be embedded in a planar fashion are formed by the metallic structure elements and the embedding material. In this configuration, metallic structure elements are freely accessible at the two main sides of the carrier. At least one portion of the structure elements may extend from one main side of the carrier to the other, and thus form plated-through holes.

To realize this design of the carrier, a metallic auxiliary carrier is used, on which the metallic structure elements are first formed. This is carried out by carrying out at least one metal deposition process. In this case, the shape of the structure elements is defined with the aid of at least one structured masking layer. The at least one masking layer may comprise openings within which the metal deposition may be carried out. With the use of one masking layer, the latter may be formed on the auxiliary carrier. With the use of a plurality of masking layers, one masking layer may be formed on the auxiliary carrier, and a further masking layer may be formed (in each case) on the previously produced masking layer. It is possible to first form a plurality of masking layers arranged one on top of another on the auxiliary carrier and then deposit the metallic structure elements. An alternative procedure consists of forming at least one masking layer on the auxiliary carrier and carrying out at least one metal deposition, and then forming at least one further masking layer thereon and carrying out at least one further metal deposition.

After the process of forming the metallic structure elements, the at least one masking layer may be removed. Afterward, the reflective embedding material for embedding the structure elements is arranged on the auxiliary carrier, and the auxiliary carrier is removed such that the carrier may be provided. This is followed by arranging radiation-emitting semiconductor chips on the carrier and arranging a conversion material for radiation conversion on the carrier provided with the semiconductor chips. This relates to one of the two main sides of the carrier. The component assemblage then present is thereafter singulated into separate radiation-emitting components. The completed components may each comprise a severed section of the carrier and at least one radiation-emitting semiconductor chip arranged thereon. Single-chip components comprising just one semiconductor chip or multi-chip components comprising a plurality of semiconductor chips may be fabricated. The at least one semiconductor chip may be covered with the conversion material.

The carrier produced in the method may be distinguished by a high radiation stability and by a high reflectivity. An efficient amount of operation of the radiation-emitting components is possible in this way. This is because the main side on which the radiation-emitting semiconductor chips and the conversion material are arranged may be formed such that the relevant main side is formed principally by the reflective embedding material. In this configuration, the carrier may comprise a small or minimal metal surface on the chip side. In this way, not only may the carrier be highly reflective, but a cost saving may additionally be made possible.

The use of the carrier comprising metallic structure elements and the reflective embedding material furthermore affords the possibility of fabricating the radiation-emitting components with a high packing density. A cost saving may be achieved in this way, too.

A further advantage is a high flexibility of the method. This concerns, for example, the configuration of the carrier. In this regard, it is possible to arbitrarily adapt the shape and/or the positioning of the metallic structure elements. A flexible adaptation may also be implemented with regard to the example of the reflective embedding material. The design freedom may be limited only by process installations used in the method.

The metallic structure elements of the carrier may be formed such that an efficient heat dissipation is possible during operation of the radiation-emitting components. Furthermore, the structure elements may be produced from metallic materials whose coefficient of thermal expansion is adapted to the coefficients of expansion of the other component parts of the radiation-emitting components. In this way it is possible to prevent mechanical stresses from occurring in the radiation-emitting components, as a result of which the components may comprise a higher reliability and lifetime.

A further advantage is that the metallic structure elements in the carrier provided may not all be short-circuited among one another. In contrast to the use of a leadframe-based carrier, therefore, there is the possibility of carrying out electrical test measurements, for example, for color locus detection (in-line color control), during the production method. As a result, it is possible to increase process reliability and yield. Furthermore, it is possible to employ a range of different application technologies to arrange the conversion material. It is even possible to carry out processes in which deviations may possibly occur. This is because, with the aid of the test measurements, such deviations may be merely instantaneously detected and corrected. The singulated radiation-emitting components may also be measured jointly, which is more rapid and more expedient than carrying out individual measurements of components.

In the singulation process carried out at the end of the method, the carrier provided with the radiation-emitting semiconductor chips and the conversion material is severed. Just the reflective embedding material of the carrier and the conversion material may be severed in this step. As a result, singulating may be carried out in a simple, cost-effective and reliable manner.

A description is given below of further possible examples and details that may be considered for the method and the radiation-emitting components produced in accordance with the method.

The components produced with the aid of the method may comprise a higher reflectivity of the carrier than conventional components comprising leadframe-based carriers. In this way, the components may be operated with a higher luminous efficiency. The luminous efficiency may be at least 2% greater, as has been established on the basis of experiments.

The metallic structure elements of the carrier may be realized in the form of metal blocks and/or metal strands. As has been indicated further above, the structure elements or at least one portion thereof may serve as electrical conductor structures. In the context of arranging the radiation-emitting semiconductor chips on the carrier, the semiconductor chips may be electrically connected to metallic structure elements of the carrier. In this way, the semiconductor chips may be electrically driven via the metallic structure elements. Possible examples of electrically contacting the semiconductor chips are described in even greater detail further below.

As has likewise been indicated above, at least one portion of the metallic structure elements of the carrier may be realized in the form of plated-through holes. As a result, the radiation-emitting components produced with the aid of the method are suitable for surface mounting (SMT, Surface Mounting Technology).

During operation of the radiation-emitting components, the semiconductor chips thereof may emit a primary light radiation. The primary light radiation may be, for example, a blue or ultraviolet light radiation. With the aid of the conversion material, the primary light radiation may be at least partly converted, that is to say converted at least partly into one or more secondary light radiations. In this way, by way of example, a white light radiation may be generated and emitted via the conversion material. As a result, the radiation-emitting components may be employed, for example, in the field of general lighting. A proportion of radiation emitted in the direction of the carrier of the components may be reflected at the carrier with a high efficiency.

The metallic auxiliary carrier used in the method may be a metal foil. The auxiliary carrier may furthermore be formed, for example, from copper.

The at least one metal deposition process carried out to form the metallic structure elements on the auxiliary carrier may be a process in which a metal is deposited or grown via the liquid phase. Such a process may be carried out in a liquid bath into which the auxiliary carrier is introduced. A portion of the auxiliary carrier may be covered with the aid of the at least one masking layer. In uncovered regions or openings of the at least one masking layer, metal may be deposited on the auxiliary carrier.

In a further example, the at least one metal deposition process is a galvanic metal deposition process, also called electroplating. In this case, the metallic auxiliary carrier serves as a deposition electrode to which an electrical potential is applied.

It is also possible for the at least one metal deposition process to be an electroless chemical deposition process (Electroless Plating). Furthermore, a plurality of galvanic metal deposition processes, a plurality of electroless chemical metal deposition processes, or a combination of at least one galvanic and at least one electroless chemical metal deposition process may be carried out.

The at least one masking layer may be a patterned photoresist layer. Such a layer may first be formed in a continuous fashion and then patterned by selective exposure and subsequent development.

At least in part, metallic structure elements may be formed in which at the beginning and at the end of forming a noble metal and therebetween at least one further metal are deposited. In the carrier produced in this way, the relevant structure elements may comprise noble metal layers at the main sides of the carrier. A reliable electrical connection to the semiconductor chips, and also a reliable electrical contacting of the radiation-emitting components may be made possible as a result. Furthermore, the structure elements may comprise a high reflectivity. The further metal may be copper, for example, as a result of which a cost-effective production of the radiation-emitting components may furthermore be promoted. The noble metal may be silver, for example. In this case, a further metal such as nickel, for example, may furthermore be deposited between the silver and the copper to form a barrier layer. In a further possible configuration, the noble metal is gold. In this case, between the gold and the copper at least one further metal, for example, palladium (adjoining the gold) and nickel (adjoining the copper), may furthermore be deposited.

At least in part metallic structure elements may be formed on the auxiliary carrier, the metallic structure elements each comprising a first and a second section. The first sections of the structure elements comprise smaller lateral dimensions than the second sections of the structure elements. The first sections of the structure elements are situated at one main side and the second sections of the structure elements are situated at the other main side of the carrier provided. Such a construction of the structure elements may be realized using a plurality of masking layers arranged one on top of another and comprising openings of different sizes. The semiconductor chips are arranged on that main side of the carrier at which the first sections of the structure elements comprising the smaller lateral dimensions are situated. In this configuration, that main side of the carrier provided to arrange the semiconductor chips and the conversion material may comprise a small or minimal metal surface and in this respect be distinguished by a high reflectivity. In contrast, the opposite main side of the carrier may comprise a larger metal surface. As a result, an efficient heat dissipation may be achieved during operation of the radiation-emitting components. Furthermore, contacting of the components may be facilitated.

At least in part metallic structure elements may be formed which are connected to one another via metallic material. This configuration may be considered in production of radiation-emitting multi-chip components comprising a plurality of semiconductor chips. In this way, the plurality of semiconductor chips of the components may be electrically interconnected. Furthermore, heat dissipation during operation of the radiation-emitting components may be promoted. It is possible for the structure elements connected to one another via metallic material to be accessible only at that main side of the carrier on which the semiconductor chips are provided. The connection of structure elements may be realized, for example, in the form of connection webs completely embedded in the reflective embedding material.

The reflective embedding material arranged after the process of forming the metallic structure elements on the auxiliary carrier may comprise a radiation-transmissive basic material and reflective particles embedded therein. The basic material may be, for example, a silicone material or an epoxy material. The reflective particles may be $TiO_2$ particles, for example.

The reflective embedding material may be applied on the auxiliary carrier such that surfaces facing away from the auxiliary carrier remain free of at least one portion of the metallic structure elements. In this way, the surfaces of the structure elements, together with the embedding material, may form one of the two main sides of the carrier. When undesired covering of the surfaces of structure elements occurs during the process of applying the reflective embedding material, a process of uncovering the surfaces may additionally be carried out in the context of arranging the embedding material or thereafter. It is possible, for example, to carry out a sandblasting process.

Various processes may be carried out to apply the reflective embedding material on the auxiliary carrier. By way of example, a molding process (mold process) carried out with the aid of a mold is possible. This may be, for example, a foil assisted transfer molding process (FAM, Foil Assisted Molding). In this process, a foil comprising a plastics material may be arranged on a mold part of the mold or transfer molding mold used. In the transfer molding process, the relevant mold part with the foil may be pressed onto metallic structure elements. Covering surfaces of the structure elements facing away from the auxiliary carrier may be avoided as a result.

The process of applying the reflective embedding material may alternatively be carried out in some other way. By way of example, potting the reflective embedding material is possible. A further possible process is applying the embedding material in the form of droplets with the aid of a printing apparatus, which is also referred to as jetting.

The process of removing the auxiliary carrier carried out after arranging the reflective embedding material may be carried out, for example, with the aid of an etching process. The other of the two main sides of the carrier may be formed by the process of removing the auxiliary carrier.

The radiation-emitting semiconductor chips used in the method and arranged on the carrier provided may be LED (Light Emitting Diode) chips. The semiconductor chips may be volume emitting semiconductor chips. Semiconductor chips of this type may emit a light radiation not only via a front side, but also via other sides such as lateral sidewalls. In this case, the semiconductor chips may comprise a radiation-transmissive chip substrate comprising sapphire, for example, on which a semiconductor layer sequence comprising an active zone that generates radiation is arranged.

The following configurations may be considered when producing an electrical connection between the radiation-emitting semiconductor chips and metallic structure elements of the carrier.

The radiation-emitting semiconductor chips may comprise rear-side contacts. In this configuration, the semiconductor chips may be so-called flip-chips. Furthermore, the rear-side contacts of the semiconductor chips are mechanically and electrically connected to metallic structure elements of the carrier using an electrically conductive connection material during the process of arranging on the carrier. The electrically conductive connection material may be, for example, solder or an electrically conductive adhesive.

Alternatively, the radiation-emitting semiconductor chips comprise front-side contacts. Furthermore, after arranging the semiconductor chips on the carrier, which may be carried out, for example, by adhesive bonding or soldering, contact structures are formed via which the front-side contacts and metallic structure elements of the carrier are electrically connected to one another. Such contact structures may be bond wires, for example.

Metallic structure elements of the carrier may each be covered with an additional reflective layer. This procedure may be considered, for example, with respect to the above-mentioned example such that those structure elements to which contact structures or bond wires are connected are subsequently covered at these locations. Reflectivity of the carrier may be improved further in this way. The reflective layer may be formed from the reflective embedding material used during the process of providing the carrier.

As has been indicated above, the carrier may be formed with regard to an efficient heat dissipation during operation of the radiation-emitting components. The following example may furthermore be considered for this purpose, in which in part metallic structure elements are formed which are provided exclusively for heat dissipation in the radiation-emitting components. In this configuration, the semiconductor chips are arranged on the structure elements provided for heat dissipation. This configuration may be employed, for example, in a use of radiation-emitting semiconductor chips comprising front-side contacts.

The conversion material used in the method may comprise a radiation-transmissive basic material and phosphor particles embedded therein, the phosphor particles bringing about the radiation conversion. The basic material may be a silicone material, for example.

The conversion material may be arranged in the form of a continuous layer on the carrier provided with the semiconductor chips. In this case, a surface of the layer of the conversion material facing away from the carrier may be planar. A configuration in which the layer of the conversion material comprises a structure or topology predefined by the semiconductor chips is also possible.

Various processes may be carried out to arrange the conversion material on the carrier provided with the semiconductor chips. By way of example, a molding or mold process carried out with the aid of a mold, spraying, lamination, a screen or stencil printing process, spincoating or metering with the aid of a dispenser (dispensing) are possible.

Singulation carried out at the end of the method may be carried out by sawing, for example. A different process such as stamping, for example, is also possible. Further processes such as, for example, testing and sorting the singulated radiation-emitting components may subsequently be carried out.

We also provide a radiation-emitting component. The radiation-emitting component comprises a carrier comprising two opposite main sides. The carrier comprises metallic structure elements and a reflective embedding material enclosing the structure elements. The main sides of the carrier are formed by the structure elements and the embedding material. Further constituents of the radiation-emitting component are at least one radiation-emitting semiconductor chip arranged on the carrier and a conversion material for radiation conversion, the conversion material covering the at least one semiconductor chip.

The radiation-emitting component may be produced in accordance with the method described above or in accordance with one or more of the above-described examples of the method. Therefore, features, examples and details described above may be correspondingly applied to the radiation-emitting component.

By way of example, one or more of the configurations mentioned below may be present. At least one portion of the metallic structure elements may serve as electrical conductor structures of the carrier. The two main sides of the carrier at which metallic structure elements may be freely accessible may comprise a planar surface. The at least one semiconductor chip may be arranged on one of the two main sides of the carrier and electrically connected to metallic structure elements. That main side of the carrier carrying the at least one semiconductor chip may comprise a small or minimal metal proportion. Consequently, the carrier may be distinguished by a high reflectivity that makes possible an efficient mode of operation of the radiation-emitting component. The metallic structure elements of the carrier may be formed such that an efficient heat dissipation is possible during operation of the radiation-emitting component. Furthermore, the metallic structure elements may be produced by carrying out at least one metal deposition process, for example, at least one galvanic or at least one electroless chemical metal deposition process. The radiation-emitting component may be a single-chip component comprising just one semiconductor chip or a multi-chip component comprising a plurality of semiconductor chips.

At least one portion of the metallic structure elements of the carrier may extend from one main side to the other main side of the carrier. In this way, the radiation-emitting component may be a surface-mountable component.

The abovementioned structure elements realized in the form of plated-through holes may each comprise a noble metal or a noble metal layer at the main sides of the carrier and therebetween at least one further metal. A reliable electrical connection to the at least one semiconductor chip and also a reliable electrical contacting of the radiation-emitting component may be made possible as a result.

At least one portion of the metallic structure elements of the carrier may each comprise a first and a second section. The first sections of the structure elements comprise smaller lateral dimensions than the second sections of the structure elements. The first sections of the structure elements are situated at one main side and the second sections of the structure elements are situated at the other main side of the carrier. The at least one semiconductor chip is arranged on that main side of the carrier at which the first section of the structure elements comprising the smaller lateral dimensions are situated. In this configuration, that main side of the carrier carrying the at least one semiconductor chip may comprise a small or minimal metal surface and thereby be highly reflective. By contrast, a larger metal proportion may be present at the opposite main side of the carrier. An efficient heat dissipation during operation of the radiation-emitting component is possible as a result.

A plurality of metallic structure elements of the carrier may connect to one another via metallic material. This configuration may be considered if the radiation-emitting component is a multi-chip component comprising a plurality of semiconductor chips. In this case, the plurality of semiconductor chips may be electrically interconnected. The structure elements connected to one another via metallic material may be situated only at that main side of the carrier on which the semiconductor chips are situated. The connection of structure elements may be realized in the form of at least one metallic connection web that may be completely embedded in the reflective embedding material.

Furthermore, individual or a plurality of the following configurations may be considered for the radiation-emitting component. The reflective embedding material may comprise a radiation-transmissive basic material and reflective particles embedded therein. The conversion material may comprise a radiation-transmissive basic material and phosphor particles embedded therein, the phosphor particles bringing about the radiation conversion. In one configuration of the radiation-emitting component comprising a plurality of semiconductor chips, the conversion material may be present in the form of a continuous layer covering the plurality of semiconductor chips. A surface of the layer of the conversion material facing away from the carrier may be planar. A configuration in which the layer of the conversion material comprises a topology predefined by the semiconductor chips is also possible.

Furthermore, the at least one radiation-emitting semiconductor chip arranged on the carrier may be an LED chip. Moreover, the at least one semiconductor chip may be a volume emitting semiconductor chip. Furthermore, the at least one semiconductor chip may comprise rear-side contacts mechanically and electrically connected to metallic structure elements of the carrier via an electrically conductive connection material. Alternatively, the at least one semiconductor chip may comprise front-side contacts electrically connected to metallic structure elements of the carrier via contact structures such as bond wires, for example. Those structure elements to which contact structures or bond wires connect may additionally be covered with a reflective layer. At least one metallic structure element of the carrier may be provided only for heat dissipation. The at least one semiconductor chip may be arranged on this structure element.

The advantageous configurations and developments that have been explained above—apart from, for example, clear dependencies or incompatible alternatives—be applied individually or else in any desired combination with one another.

The above-described properties, features and advantages and the way in which they are achieved will become clearer and more clearly understood in association with the following description of examples explained in greater detail in association with the drawings.

Possible configurations of radiation-emitting components 100 and of associated production methods will be described with reference to the following schematic figures. A carrier 150 is produced in the course of the method, which carrier may be distinguished by a high radiation stability and a high reflectivity. An efficient mode of operation of the radiation-emitting components 100 is possible as a result. A further advantage of the method is a high flexibility with regard to the configuration of the carrier 150.

In the context of production, processes known from semiconductor technology and fabrication of optoelectronic components may be carried out and materials customary in these fields may be used. Thus, they will be discussed only in part. In the same way, further processes may be carried out in addition to processes shown and described and the components 100 may be fabricated with further component parts and structures in addition to component parts and structures shown and described. The figures are merely schematic in nature and are not true to scale. In this sense, component parts and structures shown in the figures may be illustrated with exaggerated size or size reduction to afford better understanding.

FIGS. 1 to 19 show a possible method of jointly producing radiation-emitting components 100 on the basis of plan view illustrations and lateral sectional illustrations. The components are single-chip components 100 each comprising a single radiation-emitting semiconductor chip 160. A different or greater number of radiation-emitting components 100 than illustrated in the figures may be jointly produced with the aid of the method. In this sense, the figures may be interpreted as excerpt illustrations and conditions illustrated here may be provided in a multiply repeating fashion. This correspondingly applies to the further method sequences explained below.

Figure 2:
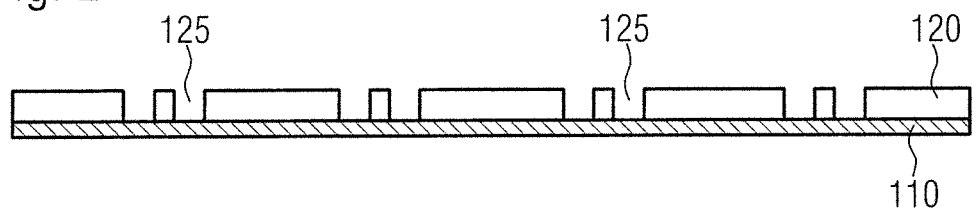

At the beginning of the method, a metallic auxiliary carrier 110 is provided, on which metallic structure elements 130 are formed by carrying out a plurality of successive metal deposition processes. This is carried out using a plurality of structured masking layers 120, 121 with the aid of which the auxiliary carrier 110 is partly covered. FIGS. 1 and 2 show the auxiliary carrier 110 after a process of forming a first masking layer 120 arranged on one main side of the auxiliary carrier 110. The term "main side" encompasses sides comprising the largest lateral surface area. The masking layer 120 comprises a plurality of cutouts or openings 125 via which the auxiliary carrier 110 is exposed at the relevant main side. The openings 125 are combined in pairs in the form of groups each comprising two openings 125, wherein the groups are arranged in a grid comprising rows and columns.

Figure 3:
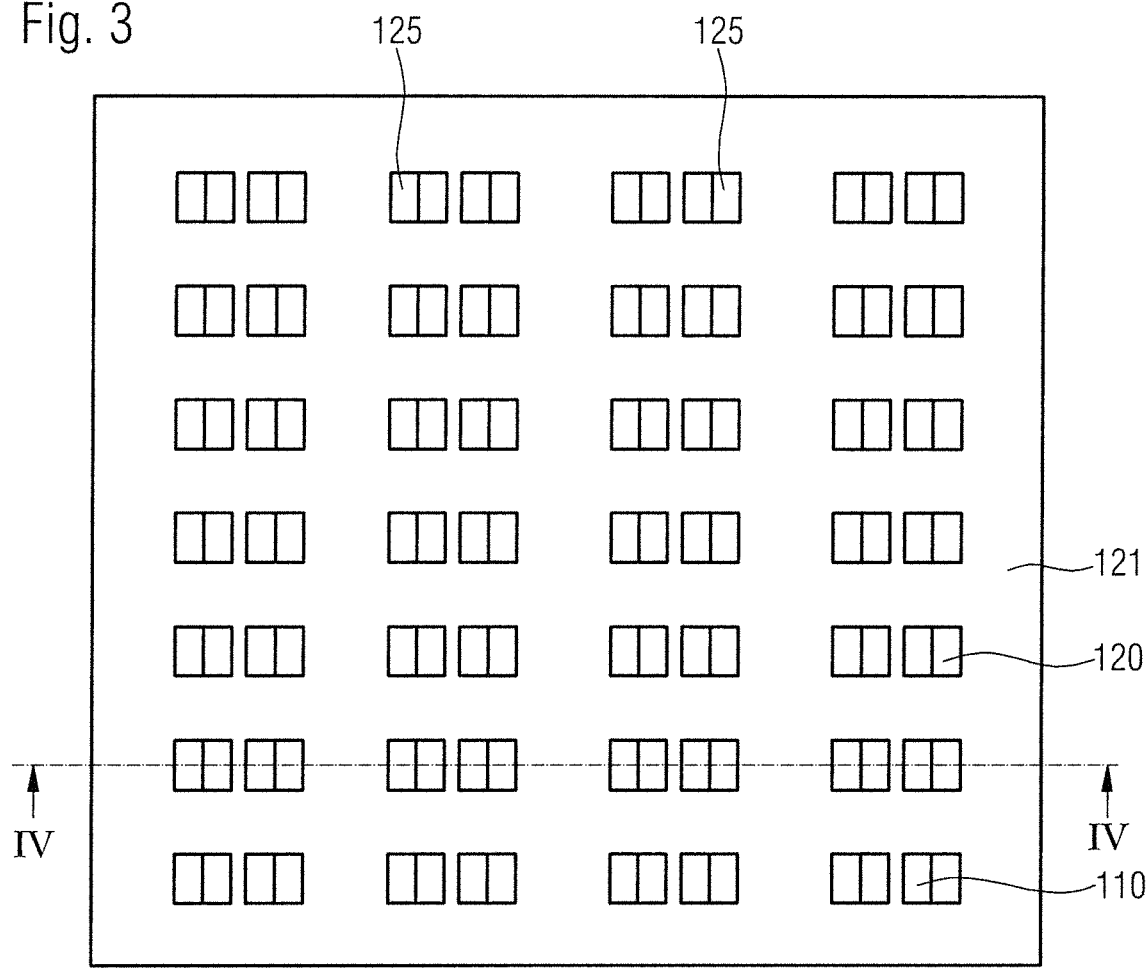
Figure 4:
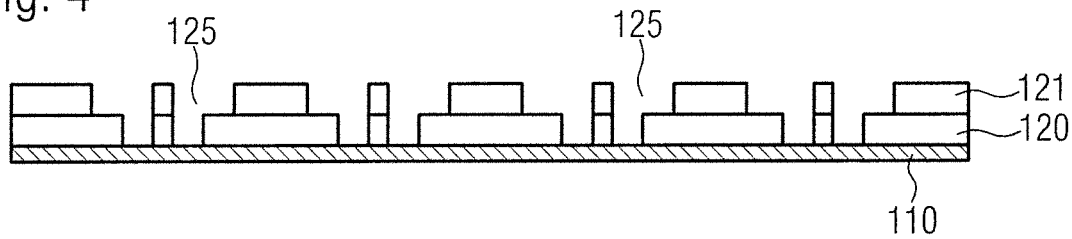

As is shown in FIGS. 3 and 4, a second masking layer 121 comprising openings 125 is subsequently formed on the first masking layer 120. The openings 125 of the further masking layer 121 are situated in the region of the openings 125 of the first masking layer 120 and merge into the latter. In the cross section shown in FIG. 4, the openings 125 of the further masking layer 121 comprise larger lateral dimensions than the openings 125 of the first masking layer 120 such that the two masking layers 120, 121 together form (upside down) L-shaped openings 125. Groups each comprising two L-shaped openings 125 oriented mirror-symmetrically with respect to one another are present.

The metallic auxiliary carrier 110 may be realized in the form of a metal foil comprising copper, for example. The masking layers 120, 121 may be photoresist layers that may be patterned by phototechnology. In this case, each of the layers 120, 121 may first be formed in the form of a continuous layer by a photoresist material being applied. The patterning may be carried out by selective exposure and subsequent development.

Figure 5:
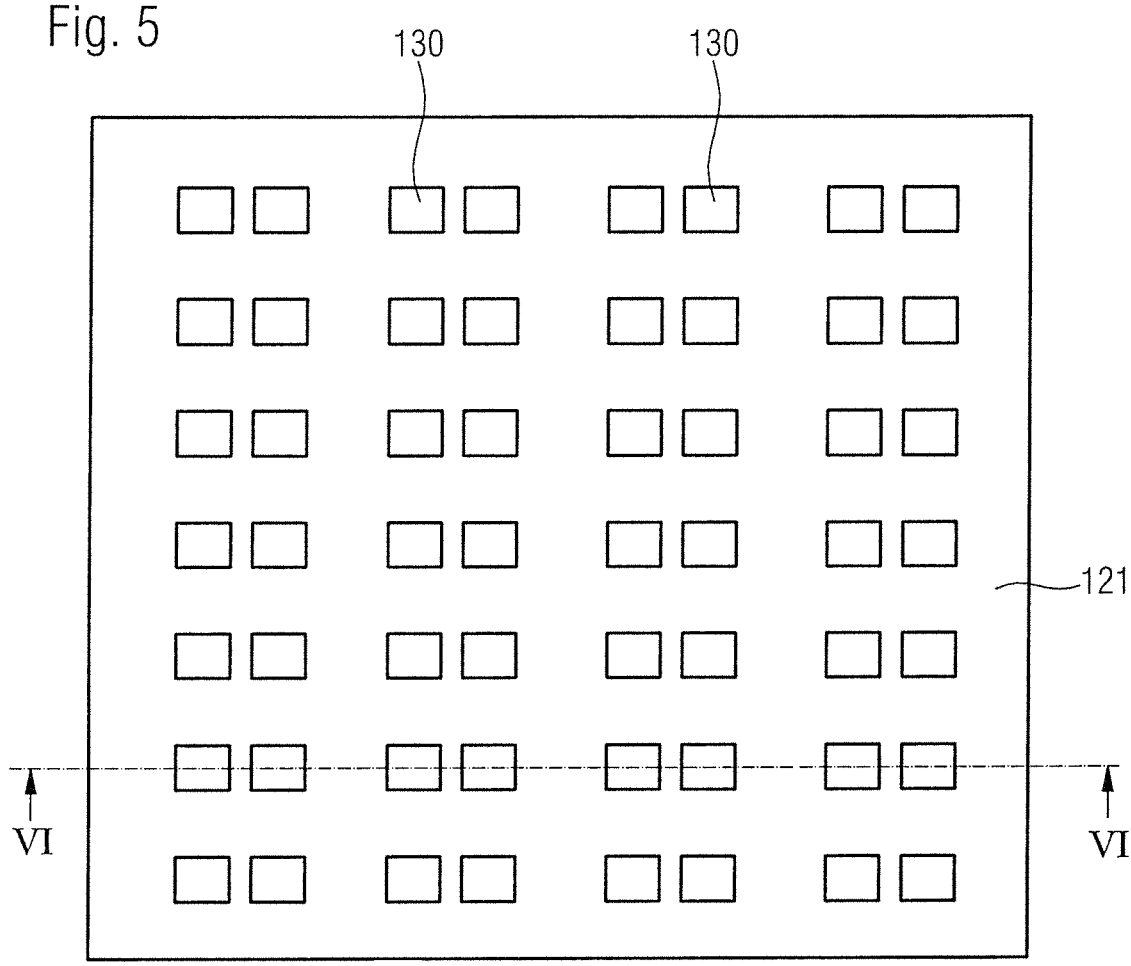
Figure 6:
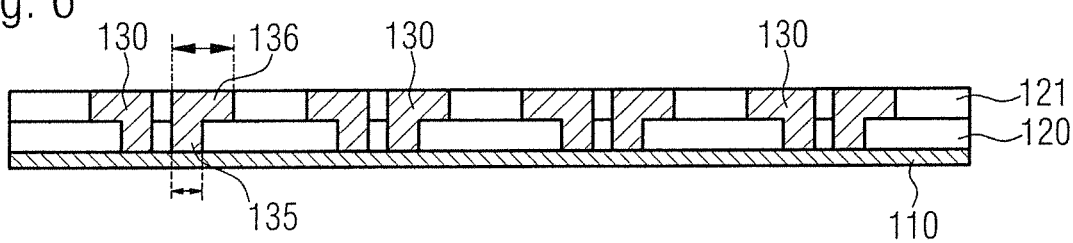
Figure 7:
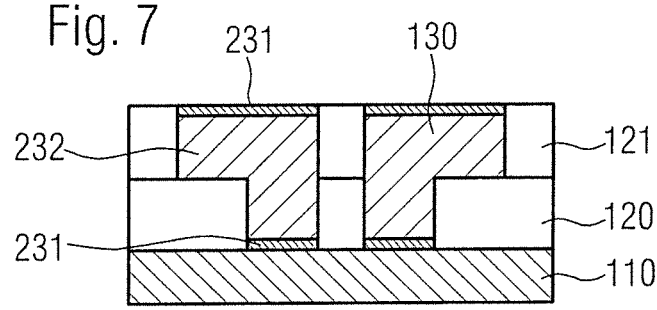

Afterward, as shown in FIGS. 5, 6 and 7, metallic structure elements 130 are formed on the auxiliary carrier 110 provided with the masking layers 120, 121. A plurality of metal deposition processes are carried out for this purpose. In this way, a metal deposition is carried out within the openings 125 of the masking layers 120, 121. The structure elements 130 terminate flush with the masking layer 121 and comprise in cross section an L-shaped configuration corresponding to the L-shaped openings 125 of the two masking layers 120, 121. In this case, the structure elements 130 each comprise a first section 135 and a second section 136. The first sections 135 of the structure elements 130 comprise smaller lateral dimensions than the second sections 136 of the structure elements 130, as indicated on the basis of one structure element 130 in FIG. 6. Groups each comprising two L-shaped structure elements 130 oriented mirror-symmetrically with respect to one another are present in a manner corresponding to the openings 125. Each group comprising structure elements 130 is assigned to one of the radiation-emitting components 100 to be produced.

FIG. 7 shows as an excerpt an enlarged lateral sectional illustration, on the basis of which further details with regard to the structure elements 130 and the production thereof become clear. During production of the structure elements 130, in each case at the beginning and at the end a noble metal 231 and therebetween a further metal 232 are deposited. In this way, the structure elements 130 may comprise surface or finish layers comprising the noble metal 231 at both main sides 151, 152 of a carrier 150 present later. This configuration enables a reliable electrical connection to radiation-emitting semiconductor chips 160 used later and a reliable contacting of the radiation-emitting components 100 produced with the aid of the method. Furthermore, the structure elements 130 may comprise a high reflectivity.

The metal 232 may be copper, for example. In this way, the radiation-emitting components 100 may be produced cost-effectively. The noble metal 231 may be silver, for example. In each case, a further metal such as nickel, for example, may furthermore be deposited between the silver 231 and the copper 232 to form a barrier layer (not illustrated). In a further possible configuration, gold is used as noble metal 232. Between the gold 231 and the copper 232 in each case at least one further metal such as, for example, palladium (adjoining the gold 231) and nickel (adjoining the copper 232) may furthermore be deposited (not illustrated).

The metal deposition processes carried out to form the metallic structure elements 130 on the auxiliary carrier 110 may be processes in which a metal is deposited in each case via the liquid phase. Processes of this type may be carried out in liquid baths into which the auxiliary carrier 110 provided with the masking layers 120, 121 is introduced. By way of example, galvanic metal deposition processes are considered. In this case, the metallic auxiliary carrier 110 serves as a deposition electrode, to which an electrical potential is applied (respectively not illustrated).

Figure 8:
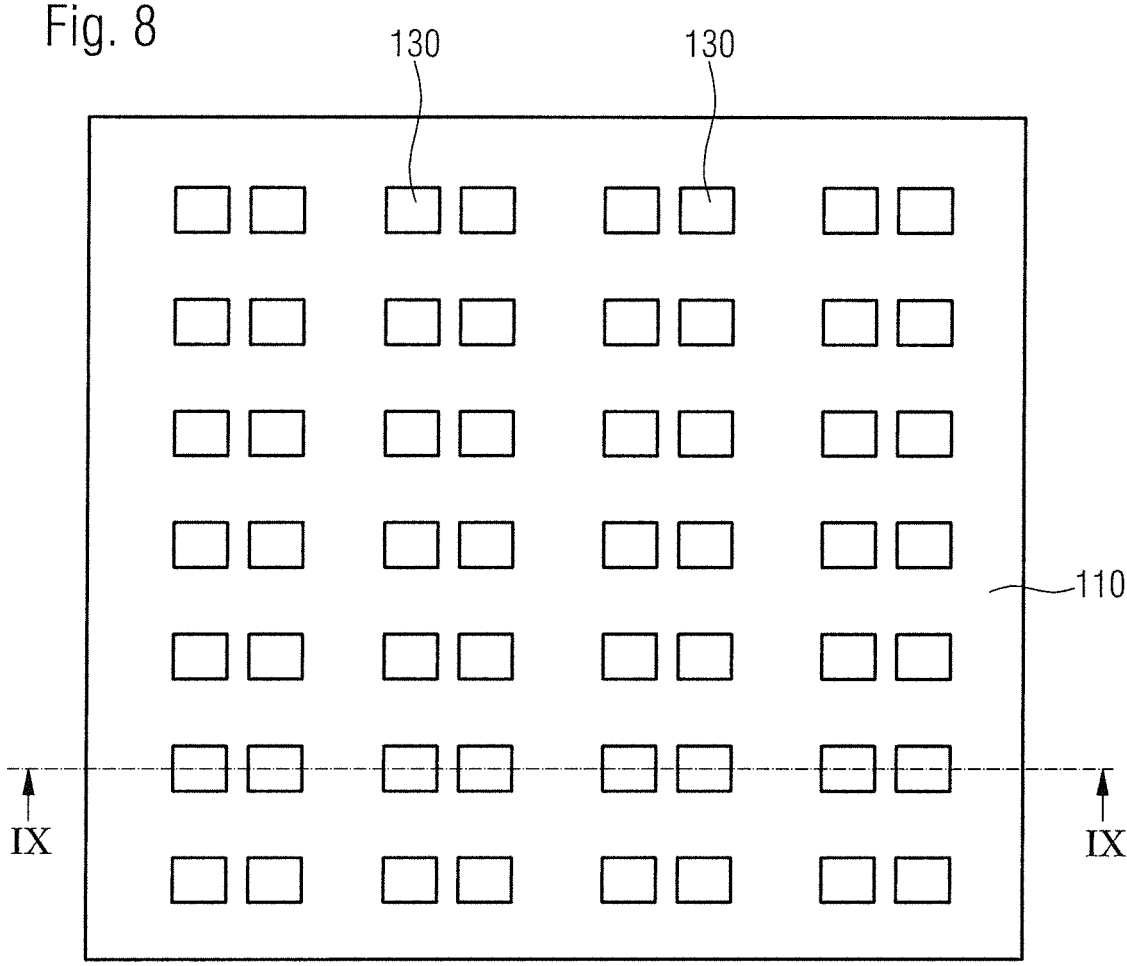
Figure 9:
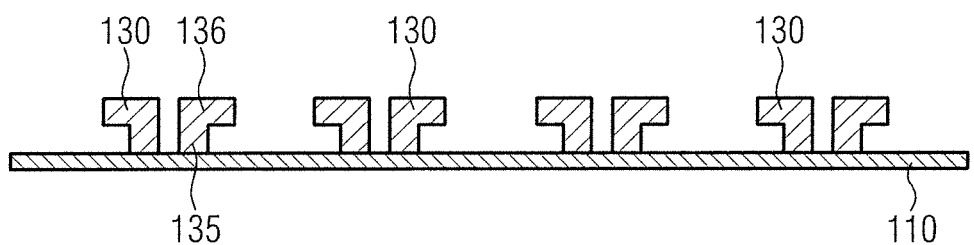
Figure 10:
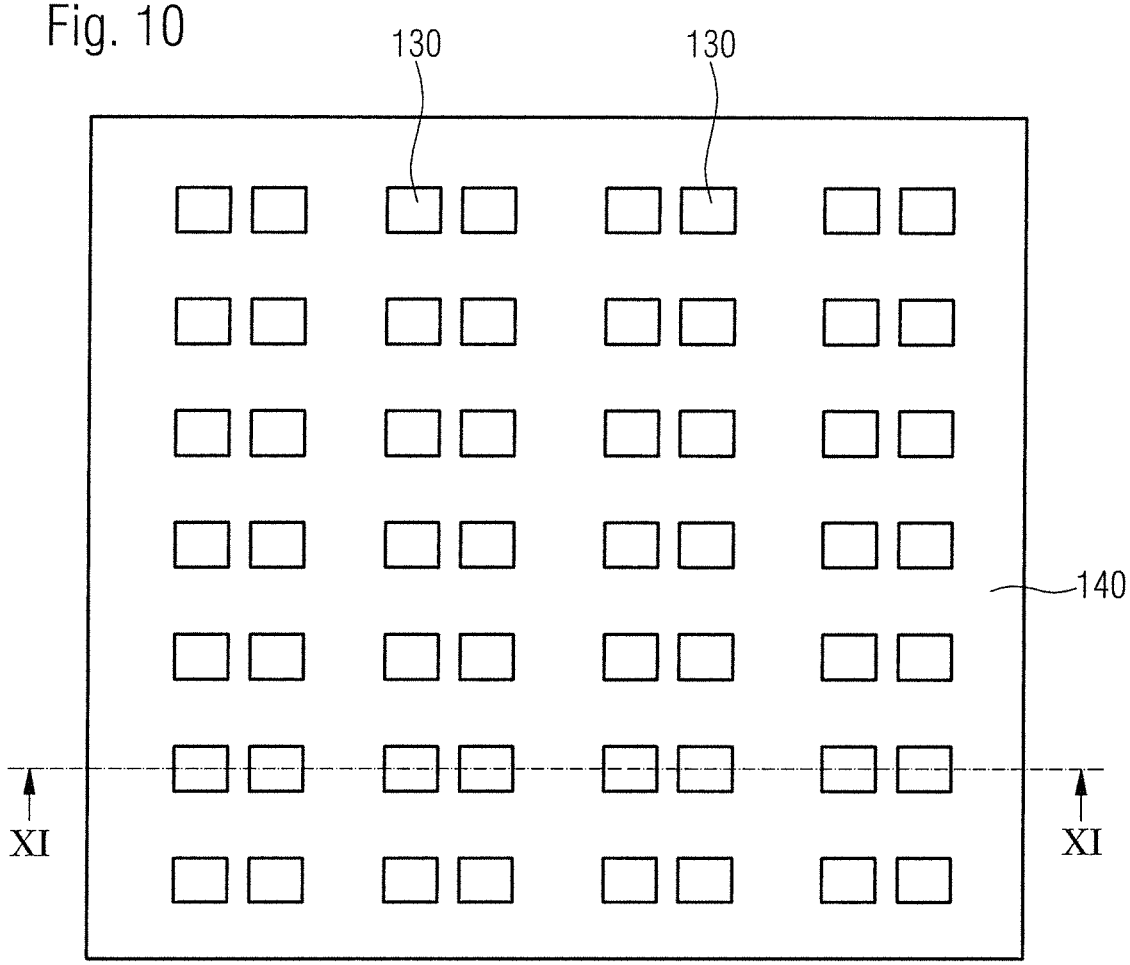
Figure 11:
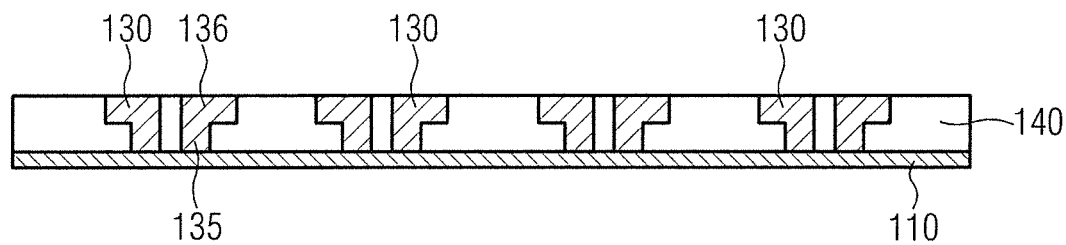

The process of forming the metallic structure elements 130 is followed, as is shown in FIGS. 8 and 9, by a process of removing the masking layers 120, 121 from the auxiliary carrier 110. This may be carried out, for example, by stripping or plasma ashing. Furthermore, as shown in FIGS. 10 and 11, a reflective embedding material 140 enclosing the structure elements 130 and serving to embed the structure elements 130 is arranged on the auxiliary carrier 110. In this case, the embedding material 140 terminates flush with the structure elements 130 such that surfaces of the structure elements 130 facing away from the auxiliary carrier 110 remain free.

The reflective embedding material 140 may comprise a radiation-transmissive basic material and reflective particles embedded therein (not illustrated). The basic material, which may also be referred to as matrix material, may be, for example, a silicone material or an epoxy material. The reflective particles may be $TiO_2$ particles, for example.

Various application processes (not illustrated) may be carried out to arrange the reflective embedding material 140 on the auxiliary carrier 110. One possible method is a molding process (mold process) carried out with the aid of a mold. By way of example, a foil assisted transfer molding process (FAM, Foil Assisted Molding) may be considered. In this case, a foil comprising a plastics material is arranged on a mold part of a transfer molding mold used for the transfer molding. In the transfer molding process, the relevant mold part with the foil may be pressed onto the structure elements 130. In this way, sealing the surfaces of the structure elements 130 facing away from the auxiliary carrier 110 may be achieved and it is thereby possible to prevent the surfaces from being covered with the embedding material 140. Further possible processes are, for example, potting the embedding material 140 or applying the embedding material 140 in the form of droplets with the aid of a printing apparatus, which is also called jetting.

It may be possible for undesired covering of the surfaces of the structure elements 130 facing away from the auxiliary carrier 110 with the embedding material 140 to occur during the process of applying the reflective embedding material 140 on the auxiliary carrier 110. This condition is also referred to as flash or matrix flash. In such a case, in the context of arranging the embedding material 140 on the auxiliary carrier 110 or thereafter it is possible to carry out an additional process of uncovering the surfaces of the structure elements 130 (not illustrated). By way of example, a sandblasting process is possible.

Thereafter, i.e., after process of curing the reflective embedding material 140 and the process of uncovering surfaces of structure elements 130 that is carried out, if appropriate, the auxiliary carrier 110 is removed. By way of example, an etching process may be carried out for this purpose. In this way, as is illustrated in FIGS. 12 and 13, a plate-shaped carrier 150 comprising the metallic structure elements 130 and the embedding material 140 is provided.

The carrier 150 comprises two opposite planar main sides 151, 152, which are both formed by the metallic structure elements 130 and the reflective embedding material 140. The metallic structure elements 130 that serve as electrical conductor structures of the carrier 150 and thus of the radiation-emitting components 100 are freely accessible at the two main sides 151, 152 of the carrier 150. Furthermore, the structure elements 130 are present in the form of plated-through holes extending from one main side 151 to the other main side 152. The first sections 135 of the structure elements 130 comprising the smaller lateral dimensions are situated at the main side 151, and the second sections 136 of the structure elements 130 comprising the larger lateral dimensions are situated at the other main side 152. In this configuration, the main side 151 of the carrier 150 may comprise a relatively small or minimal metal surface.

Figure 12:
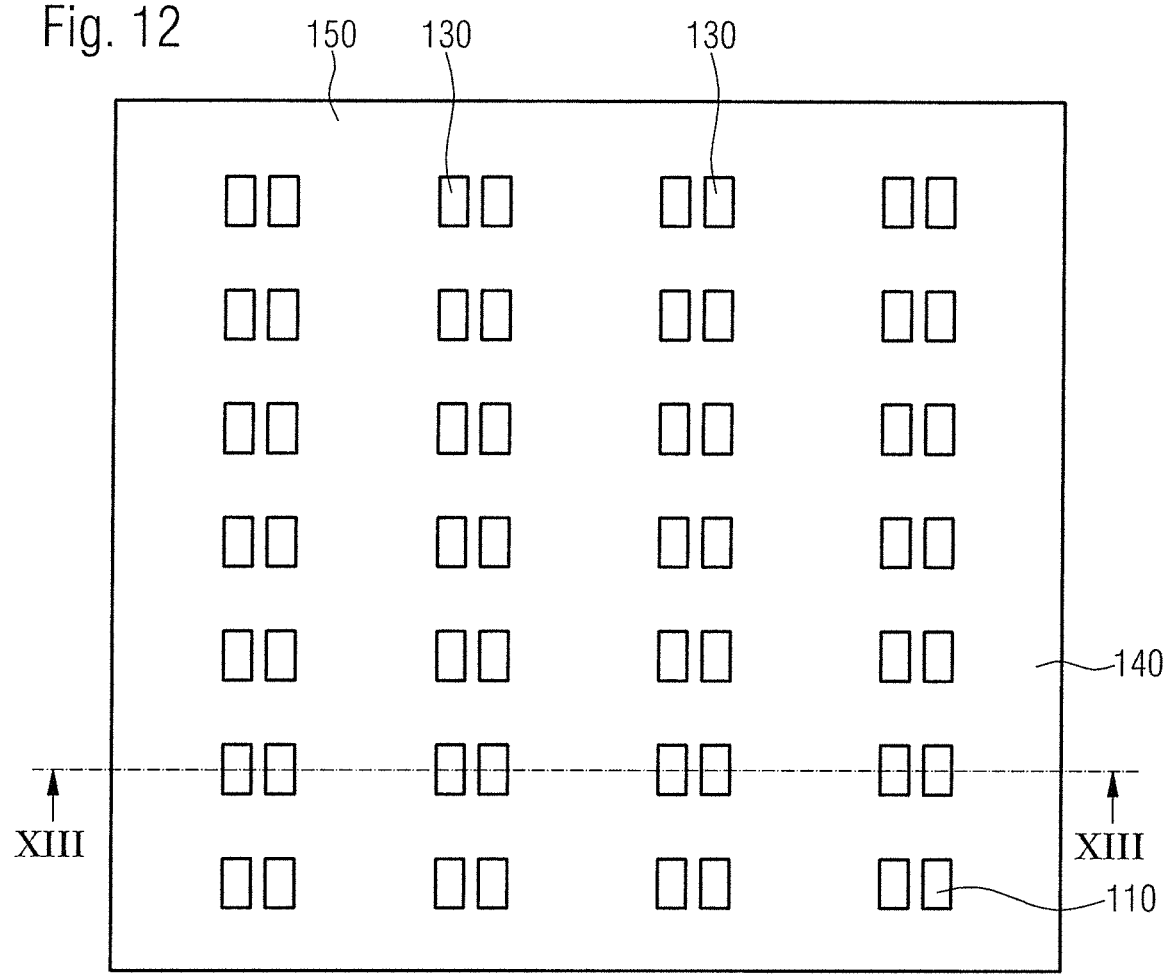
Figure 13:
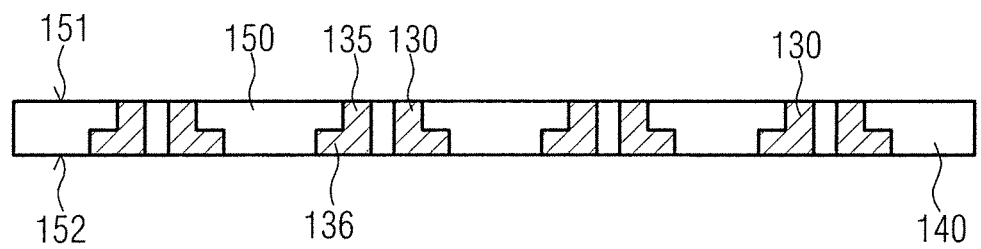

As furthermore indicated in FIGS. 12 and 13, the carrier 150, with regard to subsequent method steps, may be brought to a rotated position with respect to the previous figures. In this case, the main side 151 may be an upwardly directed front side and the other main side 152 may be a downwardly directed rear side of the carrier 150.

Figure 14:
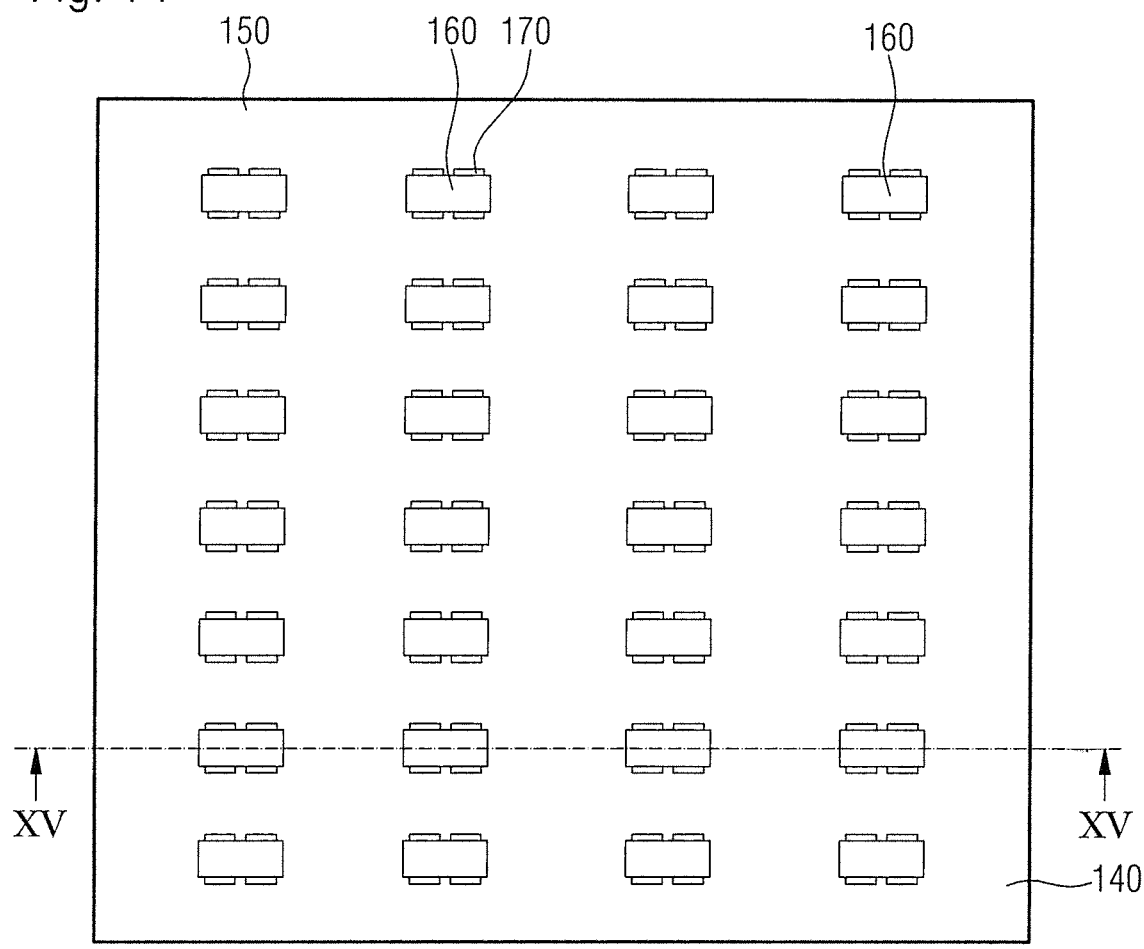
Figure 15:
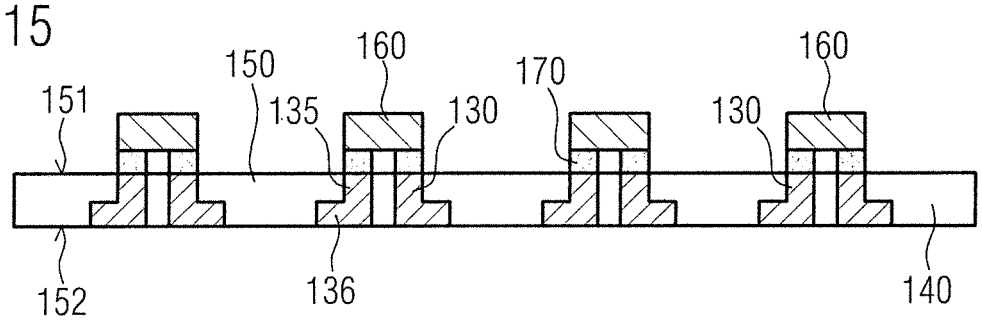

After removing the auxiliary carrier 110 and thereby providing the planar plate-shaped carrier 150, as shown in FIGS. 14 and 15, radiation-emitting semiconductor chips 160 are arranged on the carrier 150 and electrically connected to the metallic structure elements 130 thereof. The semiconductor chips 160 are arranged on the main or front side 151 of the carrier 150 at which the first sections 135 of the structure elements 130 comprising the smaller lateral dimensions are situated and which may consequently comprise a minimal metal proportion.

The radiation-emitting semiconductor chips 160 are light emitting diode chips (LED chips) realized in the form of volume emitters. During operation, semiconductor chips 160 of this type may emit a light radiation via a front side, directed upward in FIG. 15, and via lateral sidewalls. The light radiation generated by the semiconductor chips 160, hereinafter also referred to as primary light radiation may be, for example, a blue or ultraviolet light radiation.

The semiconductor chips 160 are furthermore realized in the form of so-called flip-chips comprising rear-side contacts (not illustrated). As shown in FIGS. 14 and 15, the rear-side contacts of the semiconductor chip 160 mechanically and electrically connect to the sections 135 of the metallic structure elements 130 or the noble metal layers 231 situated here (cf. FIG. 7) using an electrically conductive connection material 170 during the process of arranging on the main side 151 of the carrier 150. Each semiconductor chip 160 connects to one of the groups comprising two structure elements 130. The electrically conductive connection material 170 may be, for example, a solder or an electrically conductive adhesive.

Besides the rear-side contacts, the semiconductor chips 160 comprise further constituents (not illustrated) such as a radiation-transmissive chip substrate comprising sapphire, for example, and a semiconductor layer sequence arranged thereon and comprising an active zone that generates radiation. The chip substrate may form the front side and the sidewalls or a significant portion of the sidewalls of a semiconductor chip 160. The semiconductor layer sequence, on which the contacts may be provided, may be situated on the rear side of the chip substrate.

Figure 16:
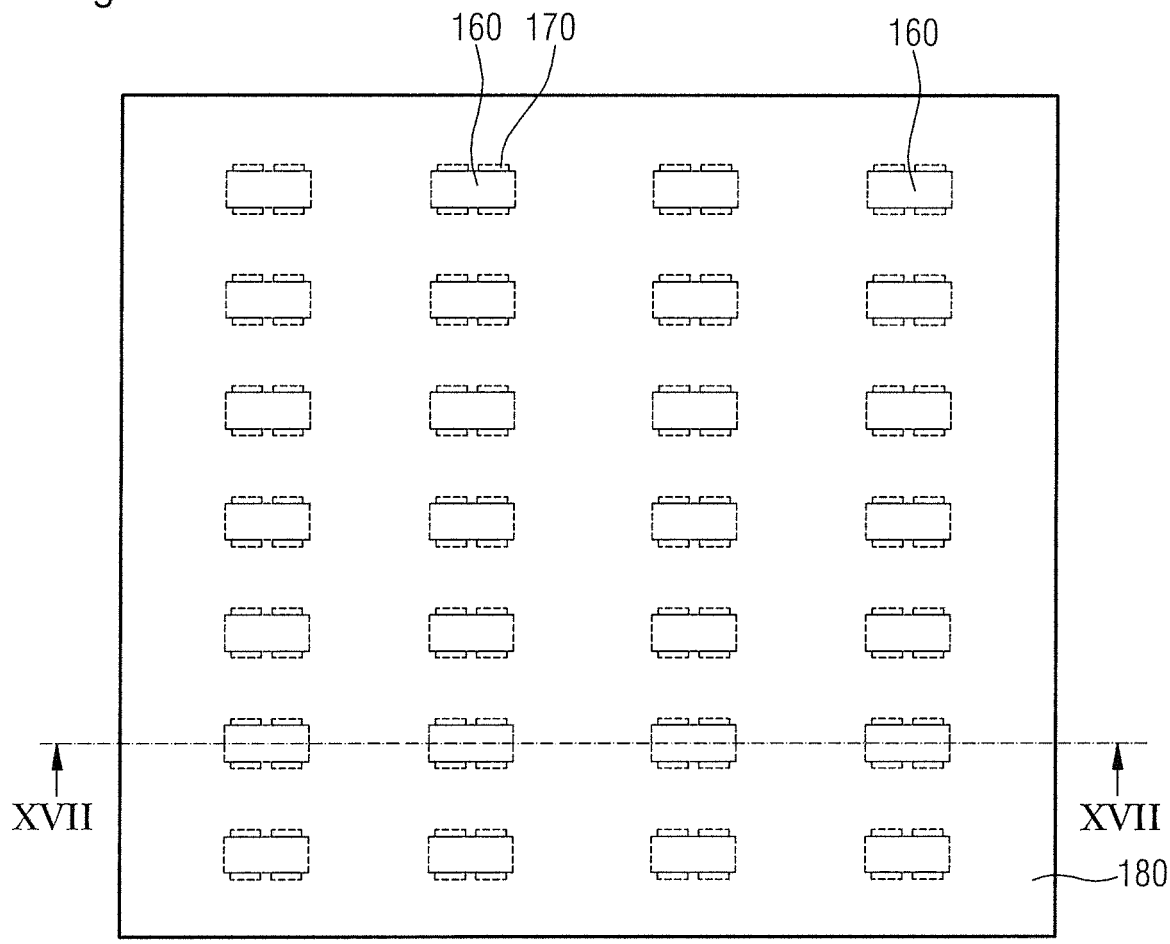
Figure 17:
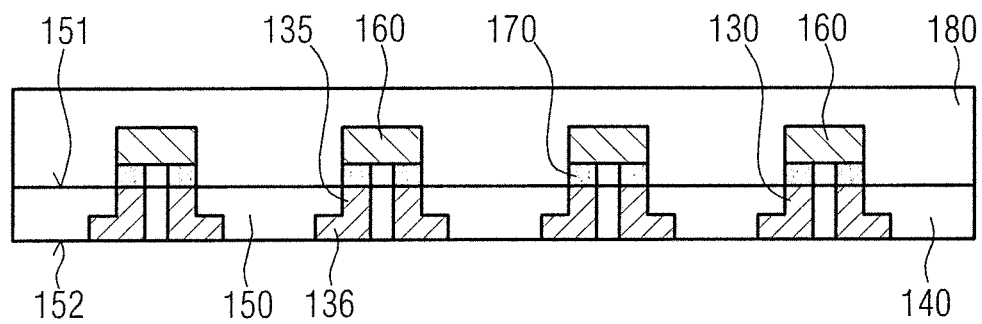

Afterward, as shown in FIGS. 16 and 17, a conversion material 180 for radiation conversion is arranged on the main side 151 of the carrier 150 provided with the radiation-emitting semiconductor chips 160. The conversion material 180 is applied in the form of a continuous layer completely covering the semiconductor chips 160. FIG. 17 shows one possible configuration in which a surface of the layer of the conversion material 180 facing away from the carrier 150 is planar. A configuration (not illustrated) in which the layer of the conversion material 180 enveloping the semiconductor chips 160 comprises a structured surface facing away from the carrier 150 and comprising a topology predefined by the semiconductor chips 160 is also possible. The abovementioned examples may be dependent on an application process carried out for applying the conversion material 180.

The conversion material 180 may comprise a radiation-transmissive basic or matrix material and phosphor particles embedded therein, the phosphor particles bringing about the radiation conversion (not illustrated). The basic material may be a silicone material, for example.

Various application processes (not illustrated) may be carried out to arrange the conversion material 180 on the carrier 150 provided with the semiconductor chips 160. By way of example, a molding process (mold process) carried out with the aid of a mold is possible. Furthermore, processes such as, for example, spraying, lamination, a screen or stencil printing process, spincoating or metering with the aid of a dispenser (dispensing) may furthermore be used.

Figure 18:
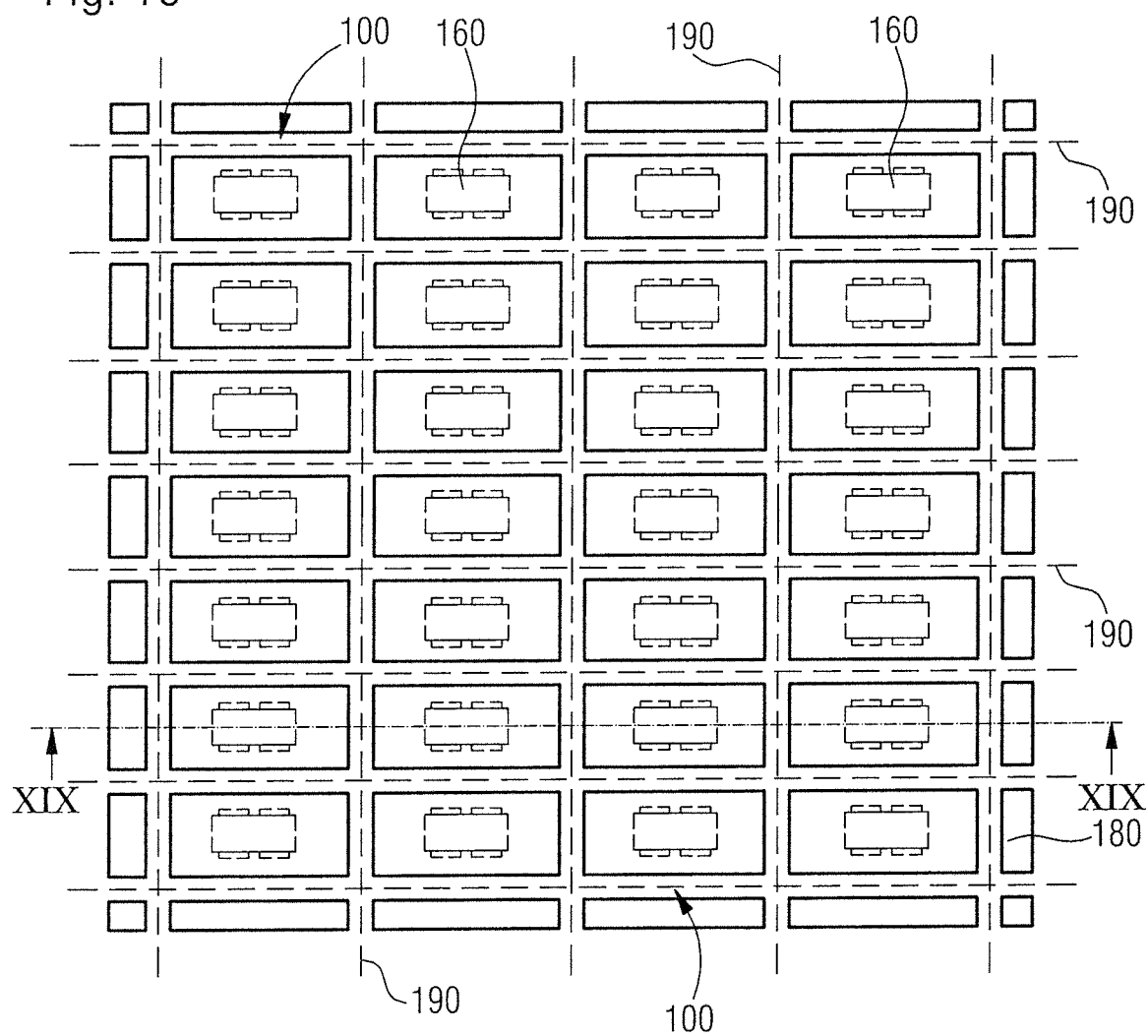
Figure 19:
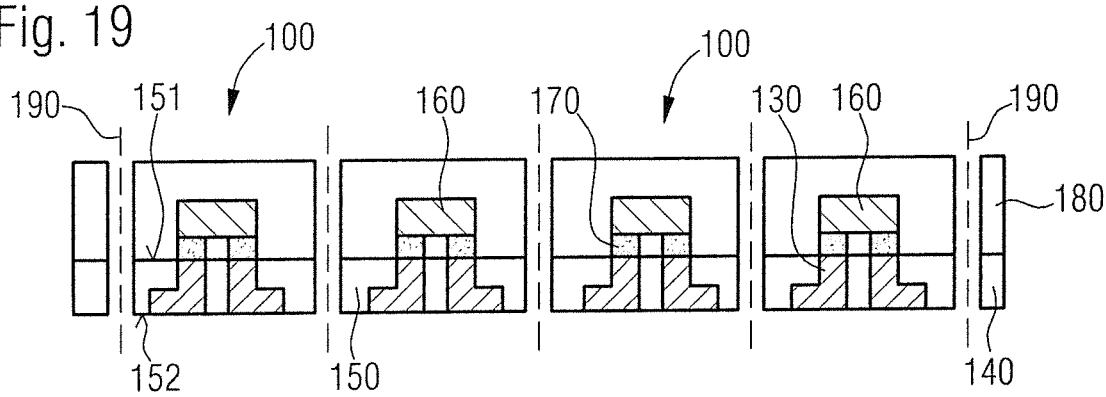

Afterward or after a process of curing the conversion material 180, the component assemblage then present, as shown in FIGS. 18 and 19, is singulated into separate radiation-emitting components 100. This process involves severing the reflective embedding material 140 of the carrier 150 and the conversion material 180 along separating lines 190 indicated in a dashed manner in FIGS. 18 and 19. The severing may be carried out by sawing, for example. It is also possible to carry out a different process such as a stamping process, for example. Further processes such as, for example, testing and sorting the radiation-emitting components 100 may subsequently be carried out (respectively not illustrated).

The radiation-emitting components 100 may comprise a parallelepipedal shape as illustrated in FIGS. 18 and 19. Each component 100 comprises a severed section of the carrier 150 comprising two metallic structure elements 130 serving as electrical conductor structures and a single radiation-emitting semiconductor chip 160 arranged thereon, the radiation-emitting semiconductor chip being enclosed by the conversion material 180. The semiconductor chips 160 of the components 100 may be electrically driven via the metallic structure elements 130. In this way, the semiconductor chips 160 may emit a primary light radiation, for example, a blue or ultraviolet light radiation as indicated above. With the aid of the conversion material 180, the primary light radiation may be at least partly converted into one or more secondary light radiations. In this way, for example, a white light radiation may be generated and emitted via the conversion material 180. In this configuration, the radiation-emitting components 100 may be used, for example, in the field of general lighting. A proportion of radiation emitted in the direction of the carrier 150 during the operation of the components 100 may be reflected at the carrier 150 (respectively not illustrated).

The radiation-emitting components 100 are suitable for surface mounting (SMT, Surface Mounting Technology). In this case, surfaces of the metallic structure elements 130 or noble metal layers 231 situated here (cf. FIG. 7), the surfaces being exposed at the main side 152 of the carrier 150, may be utilized as connection pads, with the aid of which the components 100 may be electrically connected, for example, by soldering to connection pads of a further device, for example, of a circuit board (not illustrated).

The method and the radiation-emitting components 100 produced by the method afford a series of advantages. The carrier 150 of the components 100 may be distinguished by a high radiation stability and a high reflectivity, which makes possible an efficient mode of operation of the components 100. The high reflectivity results from the configuration of the carrier 150 of the components 100 with a relatively small or minimal metal proportion at the main side 151 carrying the semiconductor chip 160 and the conversion material 180.

In contrast thereto, a larger metal surface is present at the other main side 152 of the carrier 150 of the radiation-emitting components 100. As a result, an efficient heat dissipation is possible via the metallic structure elements 130 during the operation of the components 100. Moreover, the structure elements 130 may be reliably contacted.

The production of the carrier 150 comprising the metallic structure elements 130 and the reflective embedding material 140, on which carrier semiconductor chips 160 and the conversion material 180 are subsequently arranged, furthermore makes it possible to produce the radiation-emitting components 100 with a high packing density. A cost saving may be achieved in this way.

The method may furthermore be distinguished by a high flexibility, for example, with regard to the configuration of the carrier 150. By way of example, the shape and/or the positioning of the metallic structure elements 130 may be adapted arbitrarily. Furthermore, the structure elements 130 may be produced from metallic materials whose coefficient of thermal expansion is adapted to the coefficients of expansion of the other constituents of the components 100 to be produced. As a result, it is possible to suppress an occurrence of mechanical stresses during operation of the radiation-emitting components 100. A flexible adaptation is also possible with regard to the material example of the reflective embedding material 140. In this regard, by way of example, the basic material and/or the concentration of the reflective particles may be varied.

The structure element 130 of the carrier 150 provided in the method are separated from one another and thus not short-circuited. This affords the possibility of carrying out electrical test measurements even before the singulation process, which makes it possible to increase the process reliability and the yield. Moreover, deviations, for example, with regard to the example of the conversion material 180 applied on the carrier 150, may be ascertained and corresponding correction measures may be carried out. Even after singulation, the radiation-emitting components 100 may be measured jointly. In this case, the components 100 may still be situated jointly on a carrier foil used for the singulation (not illustrated). Such a procedure is more rapid and more cost-effective than carrying out individual measurements.

In the singulation process, only the reflective embedding material 140 of the carrier 150 and the conversion material 180 are severed, and no metallic material. As a result, the singulation step may be carried out in a simple, cost-effective and reliable manner.

A description is given below of further possible variants and modifications that may be considered for a production method and radiation-emitting components 100 fabricated thereby. Corresponding features, method steps and aspects and also identical and identically acting component parts will not be described once again in detail below. Instead, for details in respect thereof, reference is made to the above description. Furthermore, aspects and details mentioned with regard to one configuration may also be applied with regard to another configuration and features of two or more configurations may be combined with one another.

One possible modification of the method consists, for example, of producing, instead of single-chip components 100 such as shown in FIGS. 18 and 19, multi-chip components comprising a plurality of radiation-emitting semiconductor chips arranged on a carrier 150. Such a configuration may be realized, for example, by the component assemblage shown in FIGS. 16 and 17 being singulated into components comprising a plurality of semiconductor chips 160, in a departure from FIGS. 18 and 19. In the components produced in this way, the semiconductor chips 160 are electrically isolated from one another and may thus be electrically driven separately from one another (not illustrated).

Furthermore, multi-chip components 100 whose semiconductor chips electrically connect to one another may be produced. For this purpose, it is possible to form a carrier 150 with structure elements electrically connected to one another. To illustrate such a variant, a further possible method of jointly producing radiation-emitting components 100 is described below with reference to the plan view illustrations and lateral sectional illustrations in FIGS. 20 to 34. The components are multi-chip components 100 each comprising two radiation-emitting semiconductor chips 160 electrically connected to one another.

Figure 20:
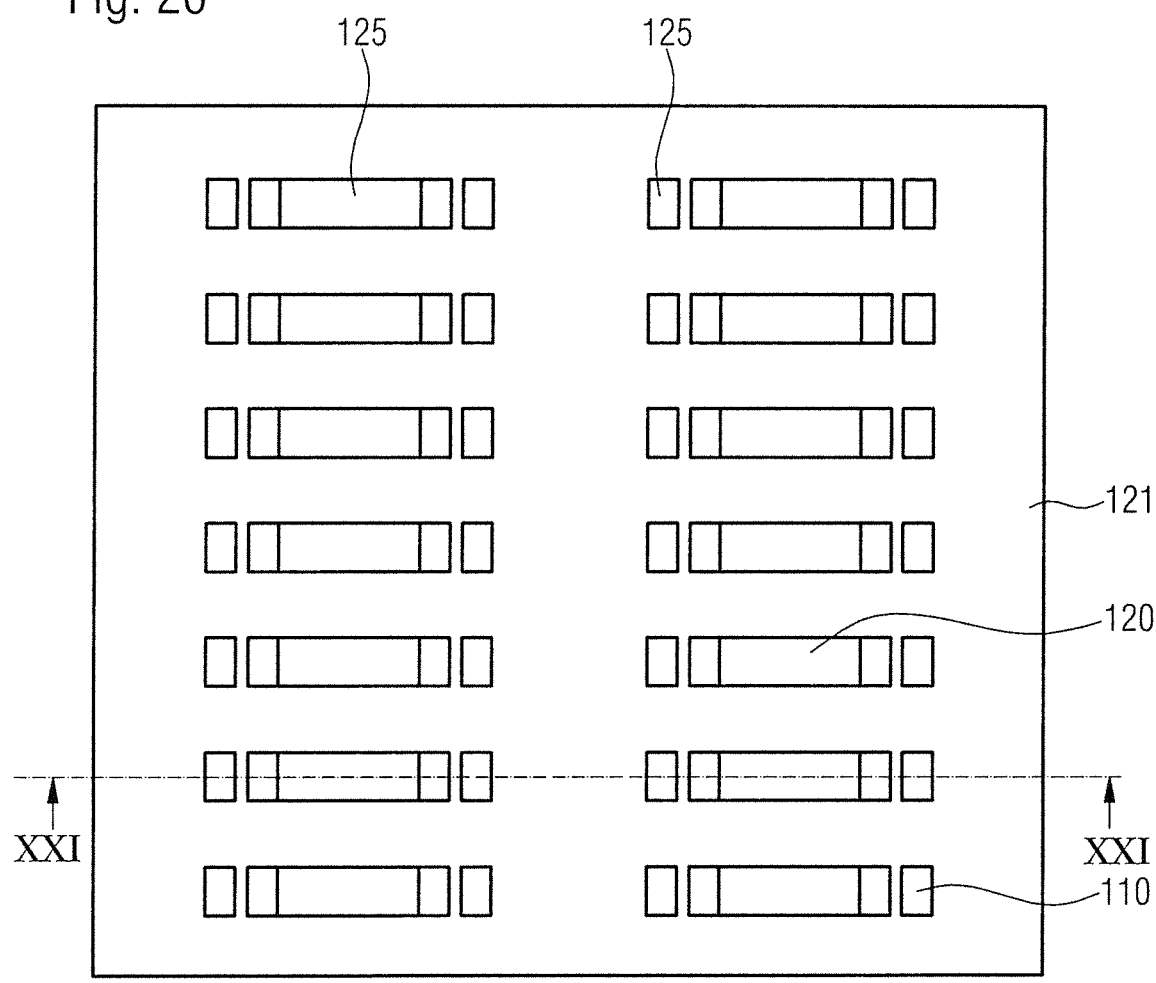
FIGS. 20 to 34 schematically show a further method sequence of producing radiation-emitting components, wherein the components are multi-chip components comprising a plurality of semiconductor chips, and wherein in part metallic structure elements are formed that are connected to one another via metallic material.
Figure 21:
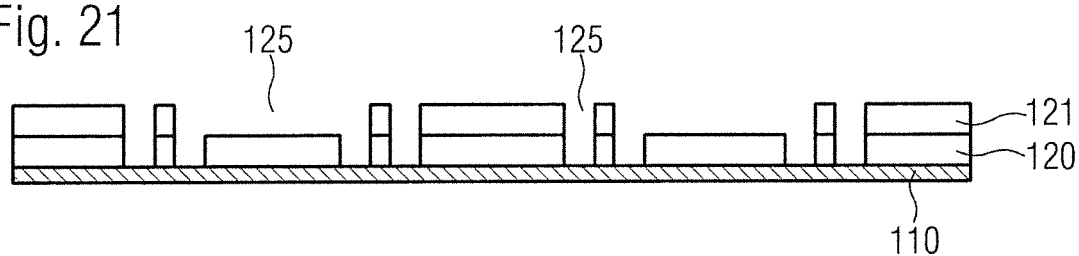

The method involves providing a metallic auxiliary carrier 110 on which metallic structure elements 130, 131 are formed by carrying out a plurality of successive metal deposition processes. Both separate structure elements 130 and structure elements 131 connected to one another via metallic material are produced. This is carried out using a plurality of structured masking layers 120, 121, 122. The latter may once again be realized in the form of photoresist layers. FIGS. 20 and 21 show the auxiliary carrier 110 after a process of forming a first masking layer 120 on one main side of the auxiliary carrier 110 and a process of forming a further masking layer 121 on the first masking layer 120. The first masking layer 120 comprises a configuration corresponding to FIGS. 1 and 2 with openings 125 combined in pairs in the form of groups each comprising two openings 125. The second masking layer 121 comprises, alongside openings 125 comprising lateral dimensions corresponding to the openings 125 of the first masking layer 120, in addition larger openings 125 comprising an elongate shape. The elongate openings 125 of the further masking layer 121 extend in each case as far as openings 125 of two adjacent groups of the first masking layer 120 and form in cross section together with them (upside down) U-shaped openings 125. Laterally with respect thereto, the smaller openings 125 of the further masking layer 121 congruently merge into the other openings 125 of the relevant groups of the masking layer 120.

Figure 22:
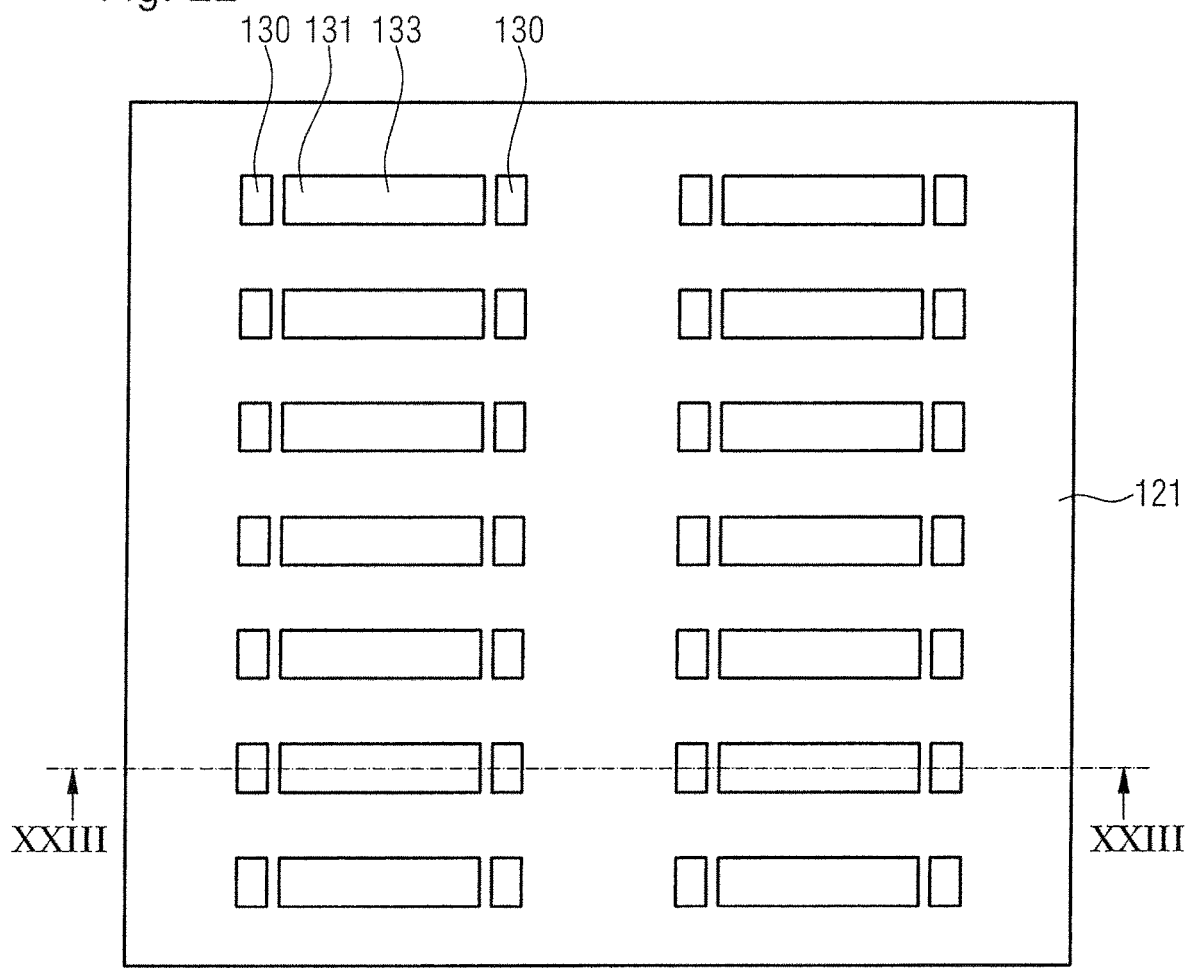
Figure 23:
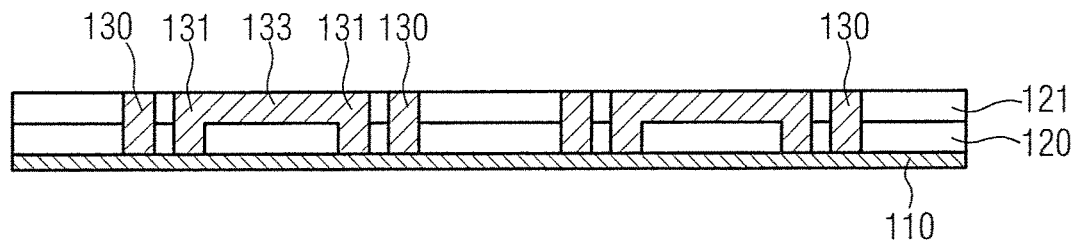

As is shown in FIGS. 22 and 23, metallic connection webs 133 and metallic structure elements 130, 131 arranged on the auxiliary carrier 110 are subsequently formed by carrying out metal deposition processes with the aid of the two masking layers 120, 121. The structure elements 130, 131 and connection webs 133 terminate flush with the second masking layer 121. In each case, two structure elements 131 connect to one another via the connection webs 133, which are situated on the first masking layer 120. The connection webs 133 together with the relevant structure elements 131 form in cross section in each case an (upside down) U-shaped structure. Laterally with respect thereto or at two sides of such U-shaped structures there are situated the other structure elements 130.

Figure 24:
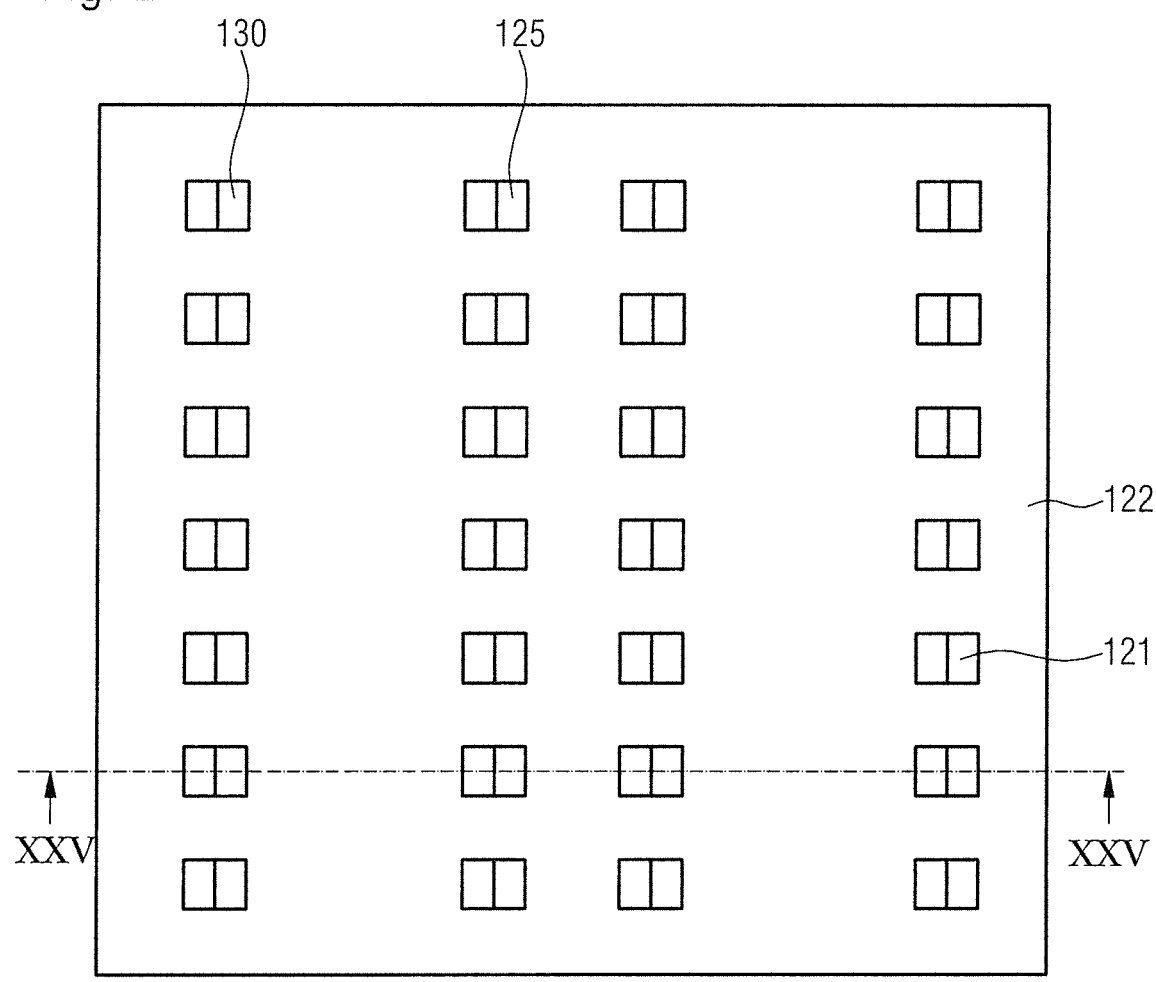
Figure 25:
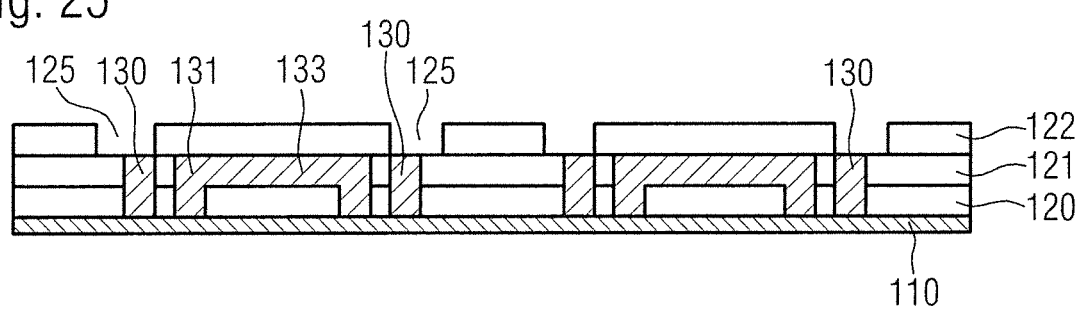

Afterward, as shown in FIGS. 24 and 25, a third masking layer 122 is formed on the previously produced layers and structures. The masking layer 122 comprises openings 125 via which the structure elements 130 are exposed and which comprise larger lateral dimensions than the structure elements 130 in the cross section shown in FIG. 25. In contrast, the other structure elements 131 and the connection webs 133 connecting them are covered by the masking layer 122.

Figure 26:
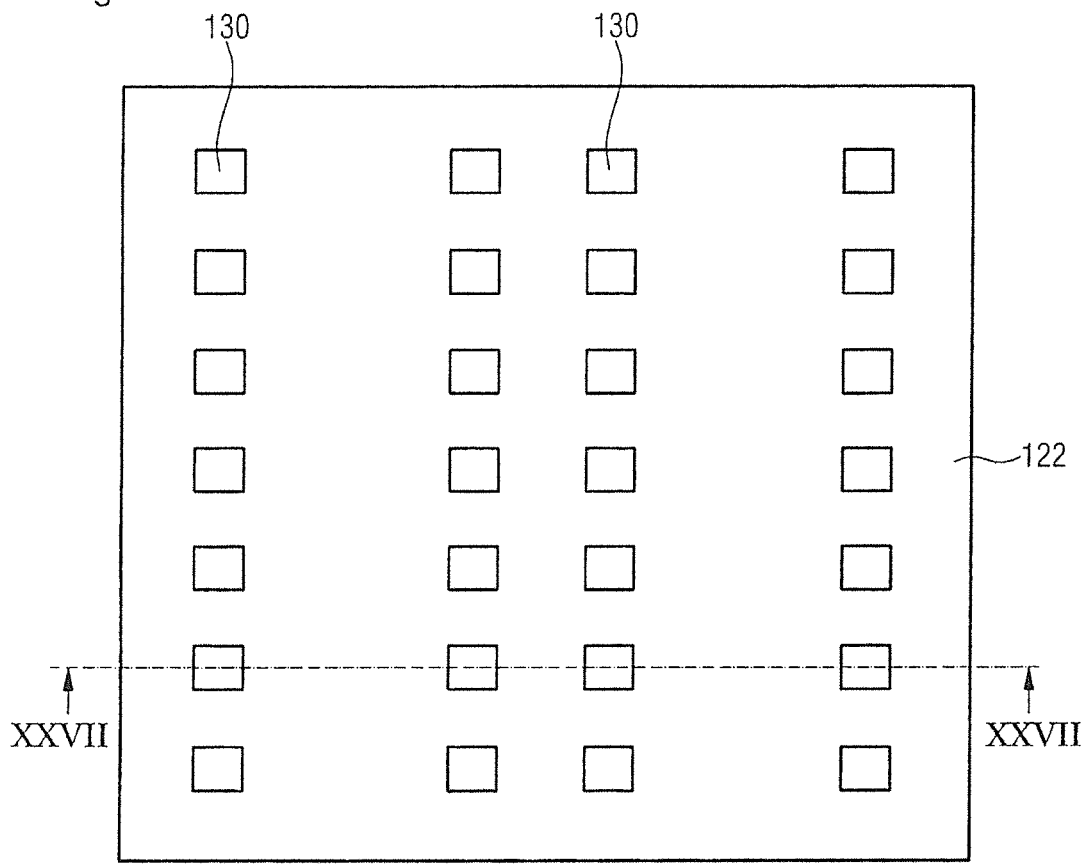
Figure 27:
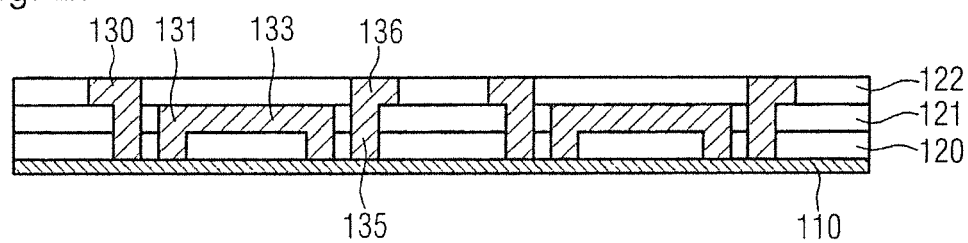
Figure 28:
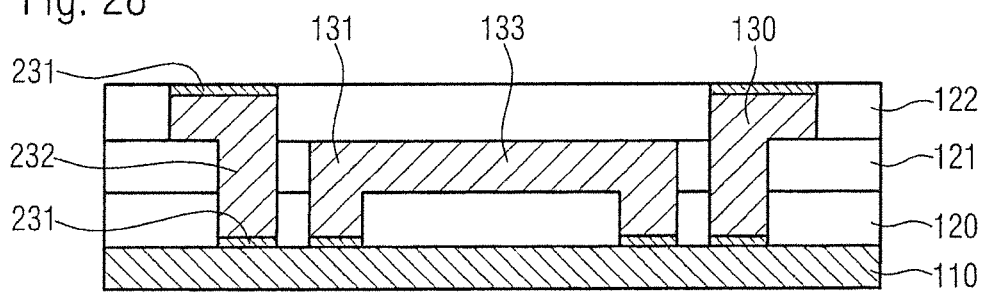

Afterward, as shown in FIGS. 26, 27 and 28, further metal deposition processes are carried out such that further metallic materials are applied in the openings 125 of the masking layer 122 and the metallic structure elements 130 then present comprise an L-shaped configuration in cross section. The structure elements 130 terminate flush with the third masking layer 122 and each comprise a first section 135 and a second section 136. The first sections 135 of the structure elements 130 comprise smaller lateral dimensions than the second sections 136 of the structure elements 130.

FIG. 28 shows as an excerpt an enlarged lateral sectional illustration on the basis of which further details with regard to the structure elements 130, 131, the connection webs 133 and the production thereof become clear. Using the first two masking layers 120, 121, initially a noble metal 231 and then a further metal 232 are deposited. Using the third masking layer 122, first likewise the metal 232 and finally the noble metal 231 are deposited. As a result, the structure elements 131 may comprise finish layers comprising the noble metal 231 on one main side 151, and the structure elements 130 may comprise finish layers comprising the noble metal 232 on both main sides 151, 152 of a carrier 150 present later. In accordance with the method explained with reference to FIGS. 1 to 19, the metal 232 may be copper, for example, and the noble metal 231 may be silver or gold, for example. Furthermore, at least one further metal, that is to say as indicated above nickel or palladium and nickel, may be deposited (not illustrated) between the noble metal 231 and the metal 232.

Figure 29:
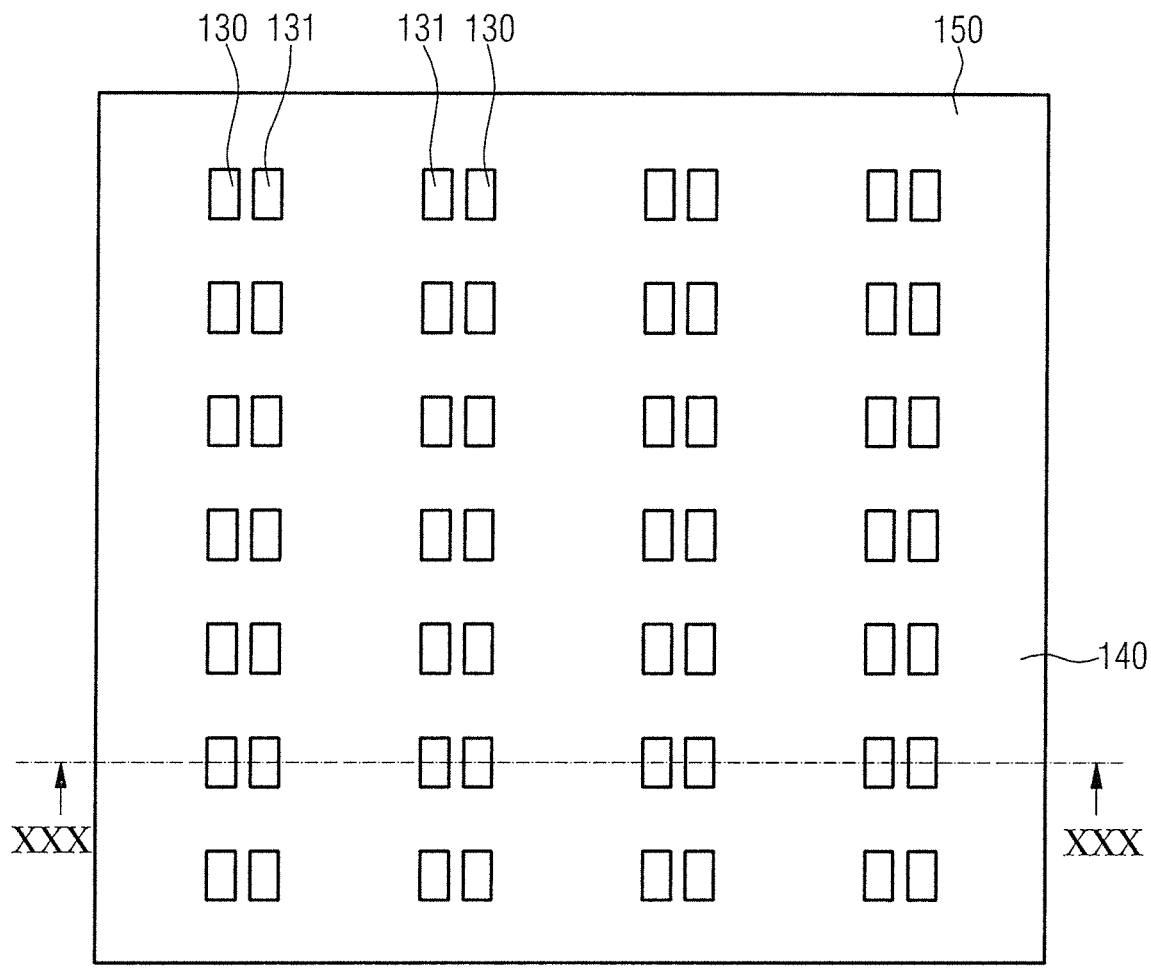
Figure 30:
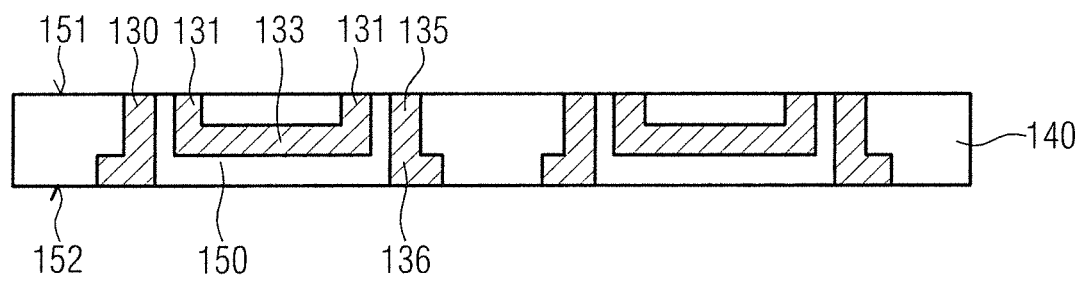

Forming the metallic structure elements 130, 131 and metallic connection webs 133 is followed by removing the masking layers 120, 121, 122, arranging a reflective embedding material 140 embedding the structure elements 130, 131 and connection webs 133 on the auxiliary carrier 110, and removing the auxiliary carrier 110. In this way, as illustrated in FIGS. 29 and 30, a planar plate-shaped carrier 150 is provided. With regard to arranging the embedding material 140 on the auxiliary carrier 110, the embedding material 140 terminates flush with the structure elements 130 such that surfaces of the structure elements 130 facing away from the auxiliary carrier 110 remain free. In contrast, the other structure elements 131 and the connection webs 133 are completely covered with the embedding material 140. When the surfaces of the structure elements 130 facing away from the auxiliary carrier 110 should be covered with the embedding material 140 during the process of applying the embedding material 140, in the context of arranging the embedding material 140 and/or thereafter an additional process of uncovering the surfaces may be carried out (respectively not illustrated).

As shown in FIGS. 29 and 30, the carrier 150 comprises two opposite planar main sides 151, 152 formed by the metallic structure elements 130, 131 and the reflective embedding material 140. The metallic structure elements 130 are present in the form of plated-through holes freely accessible at the two main sides 151, 152 of the carrier 150. The first sections 135 of the structure elements 130 comprising the smaller lateral dimensions are situated at the main side 151, and the second sections 136 of the structure elements 130 comprising the larger lateral dimensions are situated at the other main side 152 of the carrier 150. As a result, the main side 151 of the carrier 150 may comprise a relatively small proportion of metal. The structure elements 131 connected to one another in pairs via the connection webs 133 are freely accessible only at the main side 151 of the carrier 150. The connection webs 133 are completely embedded in the embedding material 140.

Figure 31:
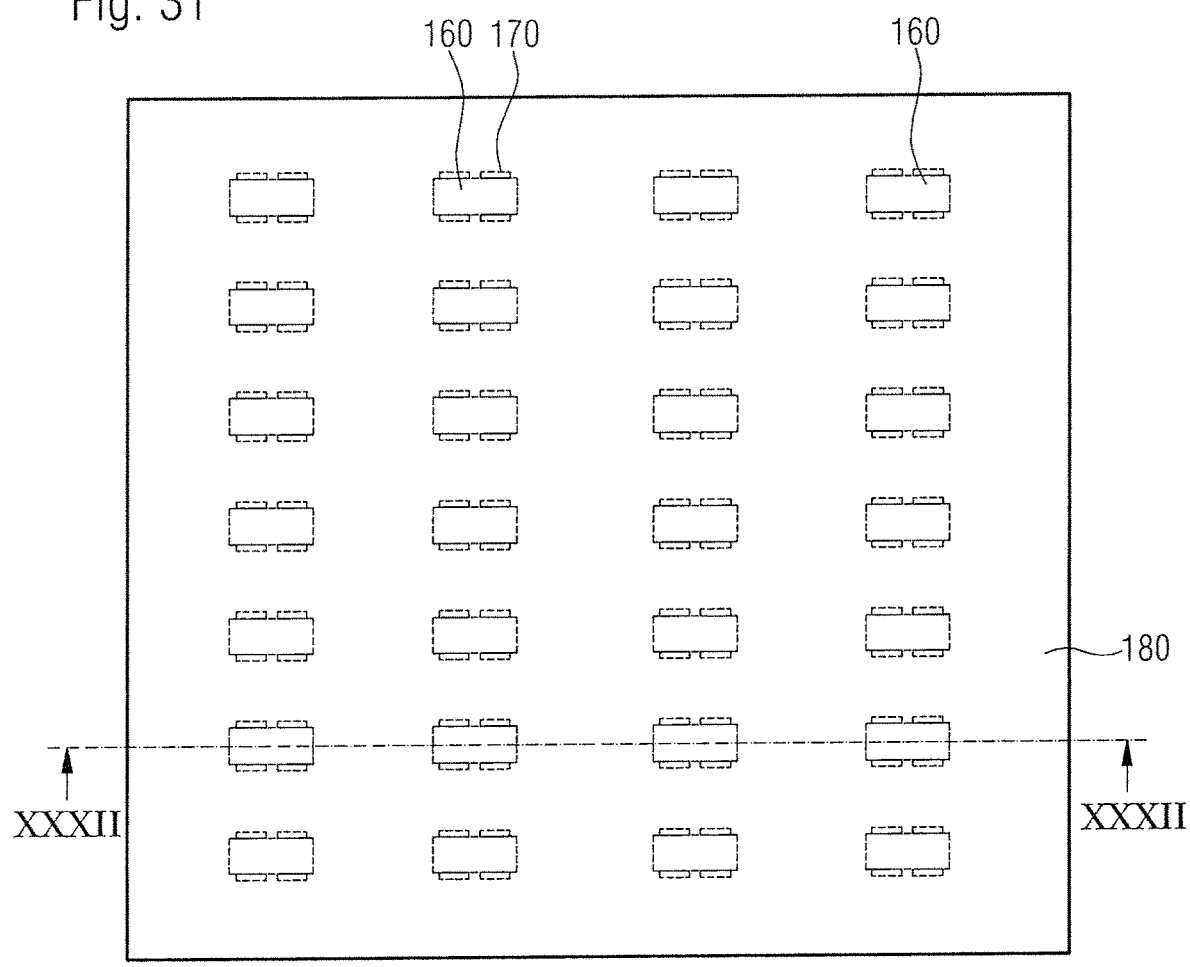
Figure 32:
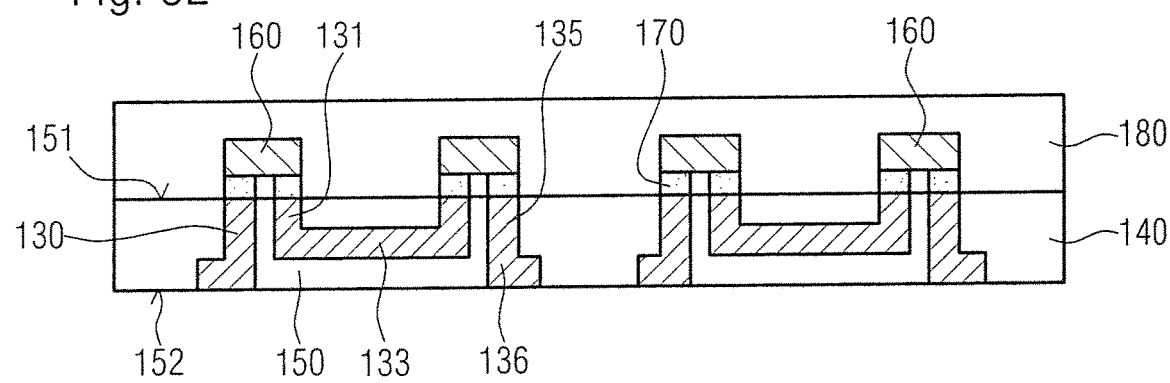

Afterward, as shown in FIGS. 31 and 32, radiation-emitting semiconductor chips 160 are arranged on the main side 151 of the carrier 150. The semiconductor chips 160 comprise rear-side contacts (not illustrated) that mechanically and electrically connect to the metallic structure elements 130, 131 of the carrier 150 using an electrically conductive connection material 170. Each semiconductor chip 160 connects to a structure element 130 and a structure element 131. Since in each case two structure elements 131 connect to one another via a connection web 133, in each case two semiconductor chips 160 also electrically connect to one another in this configuration.

As furthermore shown in FIGS. 31 and 32, a conversion material 180 for radiation conversion is subsequently arranged on the main side 151 of the carrier 150 provided with the semiconductor chips 160. The conversion material 180 is applied in the form of a continuous layer completely covering the semiconductor chips 160.

Figure 33:
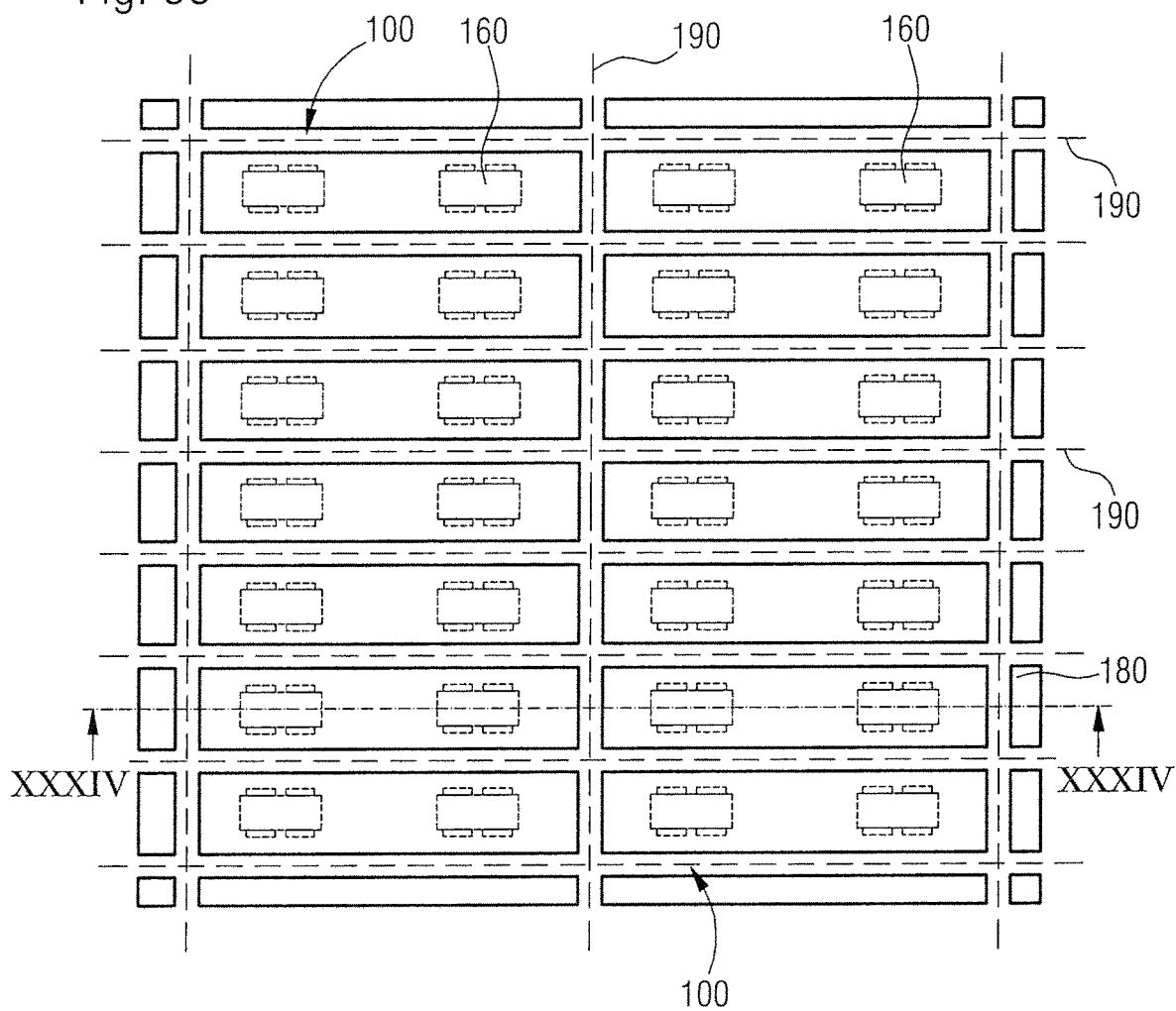
Figure 34:
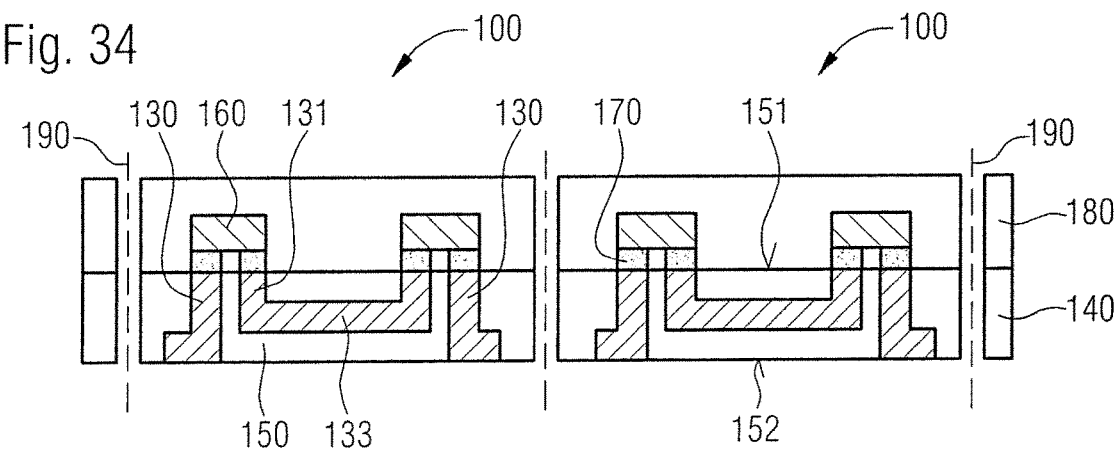

Thereafter, as shown in FIGS. 33 and 34, the component assemblage then present is singulated into separate radiation-emitting components 100. For this purpose, the reflective embedding material 140 of the carrier 150 and the conversion material 180 are severed along separating lines 190 indicated in a dashed manner in FIGS. 33 and 34. The surface-mountable components 100 formed as a result each comprise a severed section of the carrier 150, with two structure elements 130 and with two structure elements 131 connected via a connection web 133, and two radiation-emitting semiconductor chips 160 arranged thereon and enclosed by the conversion material 180. The two semiconductor chips 160 electrically connected to one another may be electrically driven via the structure elements 130.

The method sequence explained with reference to FIGS. 20 to 34 and the radiation-emitting components 100 produced thereby may be distinguished by the same advantages as have been explained above. In this regard, the main side 151 of the carrier 150 may comprise a relatively small proportion of metal and be highly reflective as a result, which makes possible an efficient mode of operation of the components 100. Since the metallic structure elements 130, 131 of the carrier 150 provided in the method are not all short-circuited among one another, it is possible still to carry out electrical test measurements before singulation. Furthermore, heat dissipation during the operation of the components 100 may be promoted by the configuration of the structure elements 131 connected to one another via a connection web 133.

The method explained with reference to FIGS. 20 to 34 may be modified such that radiation-emitting components 100 comprising more than two radiation-emitting semiconductor chips 160 electrically connect to one another are produced. By way of example, configurations comprising a string comprising a plurality of semiconductor chips electrically connected and arranged alongside one another in a series, for example, comprising ten semiconductor chips, are possible. Further examples are configurations comprising arrangements or arrays comprising semiconductor chips electrically connected and positioned in a matrixlike manner in the form of rows and columns, wherein, for example, arrangements comprising 2×2, 3×3 or 2×3 semiconductor chips may be realized. Such configurations may be realized by providing a carrier 150 coordinated therewith, which comprises metallic structure elements electrically connected to one another via metallic material or metallic connection webs. In this case, the carrier 150 may comprise arrangements comprising more than two structure elements electrically connected to one another. Configurations are also possible in which the provided carrier 150 does not comprise separate structure elements, but rather exclusively arrangements comprising a plurality of structure elements electrically connected to one another (respectively not illustrated).

Not only semiconductor chips 160 realized in the form of flip-chips and comprising rear-side contacts, but also semiconductor chips 165 comprising front-side contacts may be employed in the production of radiation-emitting components 100. To illustrate such a variant, a further possible method of jointly producing radiation-emitting components 100 is described below with reference to the plan view illustrations and lateral sectional illustrations in FIGS. 35 to 46. The components are single-chip components 100 each comprising a single radiation-emitting semiconductor chip 165.

Figure 35:
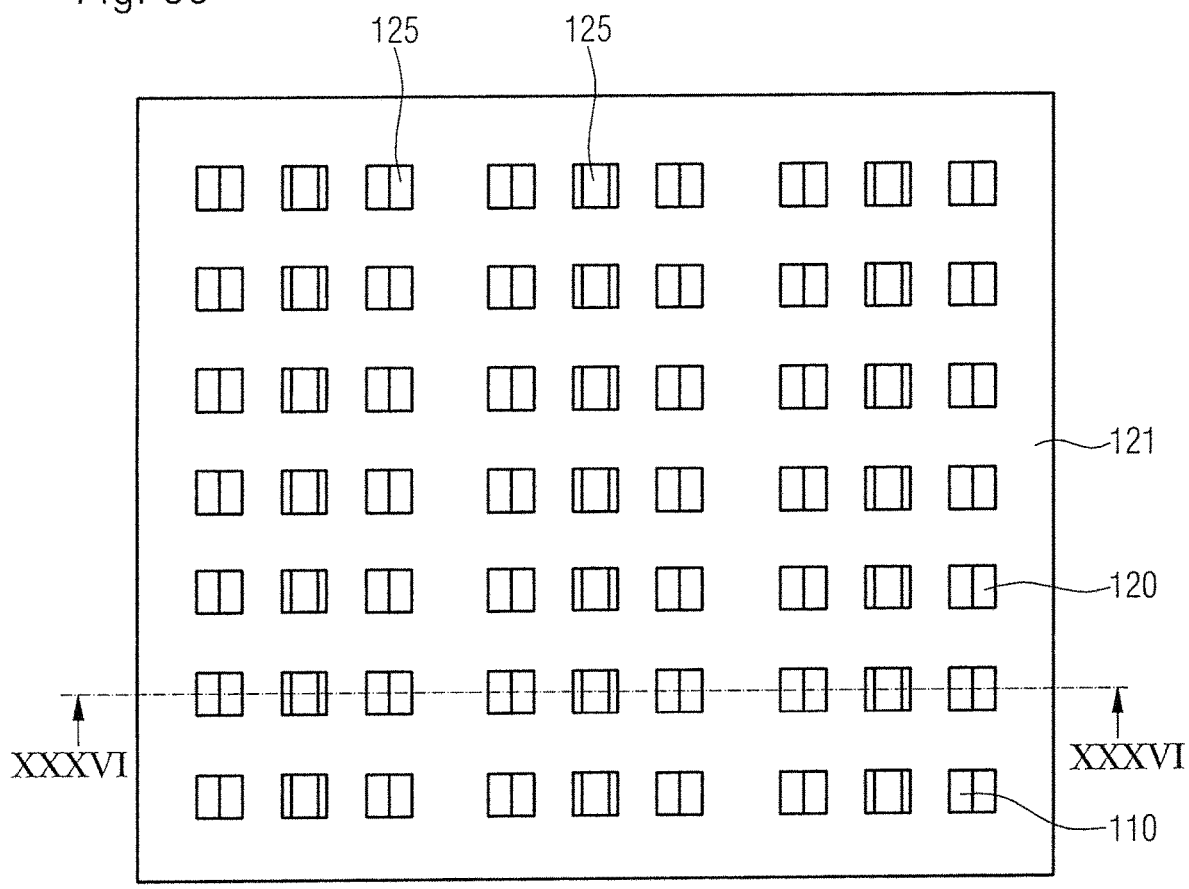
FIGS. 35 to 46 schematically show a further method sequence of producing radiation-emitting components, wherein radiation-emitting semiconductor chips electrically connect to metallic structure elements of a carrier using bond wires.
Figure 36:
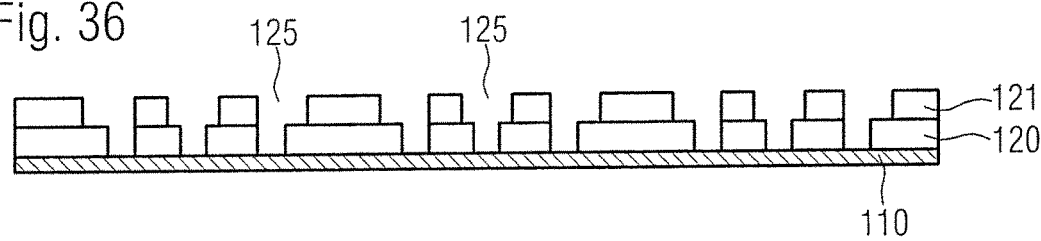

The method involves providing a metallic auxiliary carrier 110, on which metallic structure elements 130, 132 are formed by carrying out a plurality of successive metal deposition processes. This is preceded, as shown in FIGS. 35 and 36, by forming a first masking layer 120 comprising openings 125 on one main side of the auxiliary carrier 110 and forming a further masking layer 121 comprising openings 125 on the first masking layer 120. The openings 125 of the first masking layer 120 are combined in the form of groups each comprising three openings 125 arranged alongside one another in a series. The openings 125 of the further masking layer 121 are situated in the region of the openings 125 of the first masking layer and merge into the latter. In the cross section shown in FIG. 36, the openings 125 of the further masking layer 121 comprise larger lateral dimensions than the openings 125 of the first masking layer 120. Furthermore, the openings 125 of the second masking layer 121 are arranged such that the two masking layers 120, 121 jointly comprise (upside down) L-shaped openings 125 and, in each case between two L-shaped openings 125 oriented mirror-symmetrically with respect to one another, an (upside down) T-shaped opening 125.

Figure 37:
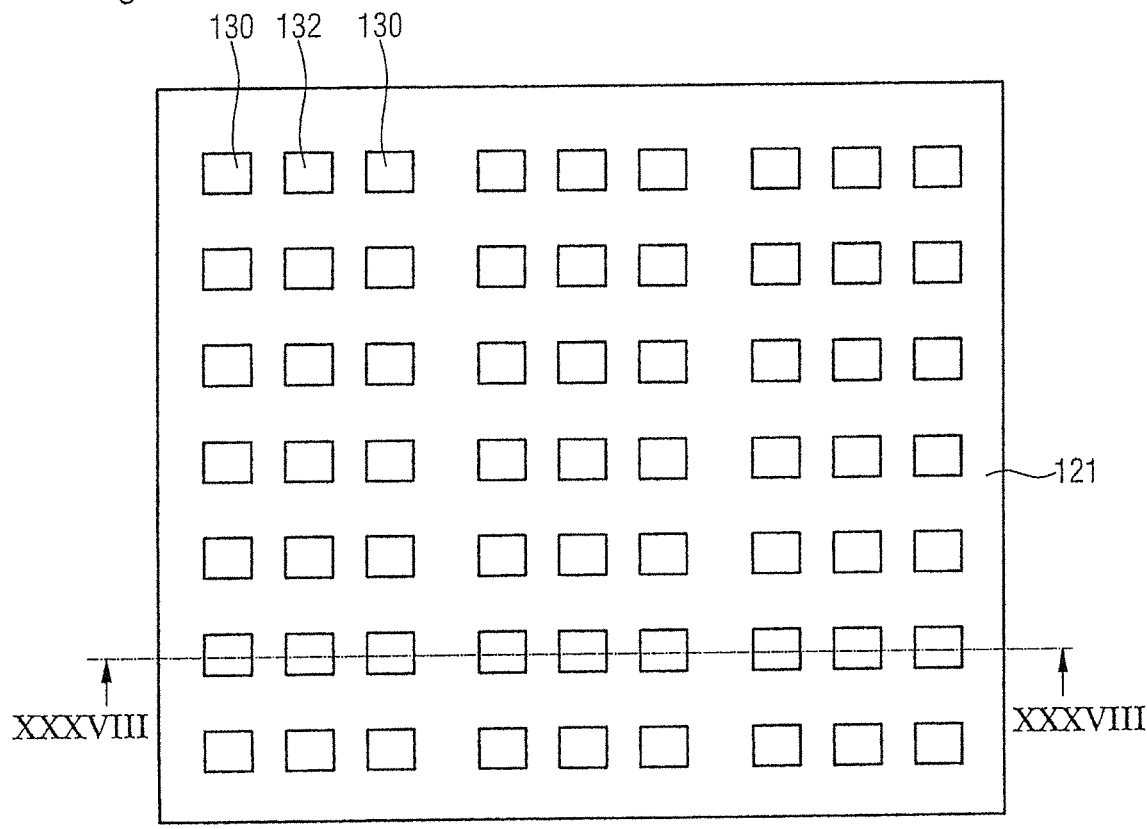
Figure 38:
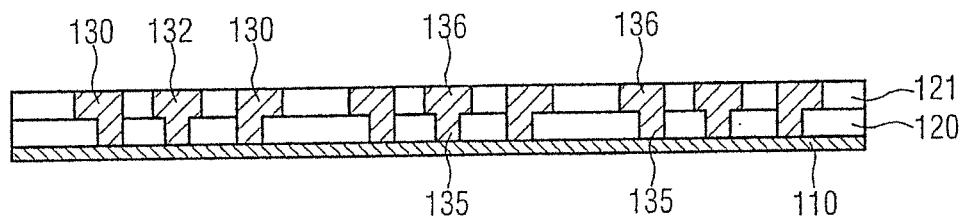

Afterward, as shown in FIGS. 37 and 38, metallic structure elements 130, 132 are formed on the auxiliary carrier 110 provided with the masking layers 120, 121 by carrying out a plurality of metal deposition processes. The structure elements 130, 132 terminate flush with the second masking layer 121. In cross section L-shaped structure elements 130 and T-shaped structure elements 132 situated between in each case two L-shaped structure elements 130 are formed in accordance with the shape of the openings 125 of the two masking layers 120, 121. Both the structure elements 130 and the structure elements 132 each comprise a first section 135 and a second section 136. The first sections 135 of the structure elements 130, 132 comprise smaller lateral dimensions than the second sections 136 of the structure elements 130, 132. In the radiation-emitting components 100, the structure elements 132 are provided exclusively as thermal blocks for heat dissipation, whereas the other structure elements 130 (also) serve as electrical conductor structures.

As in the method sequence explained above with reference to FIGS. 1 to 19, during production of the structure elements 130, 132, in each case at the beginning and at the end a noble metal 231 such as, for example, silver or gold and therebetween a further metal 232 such as, for example, copper are deposited such that the structure elements 130, 132 may comprise a configuration corresponding to FIG. 7. In a carrier 150 present later, the structure elements 130, 132 may in this way comprise finish layers comprising the noble metal 231 at both main sides 151, 152. Between the noble metal 231 and the metal 232, at least one further metal, that is to say as indicated above nickel or palladium and nickel, may be deposited (respectively not illustrated).

Figure 39:
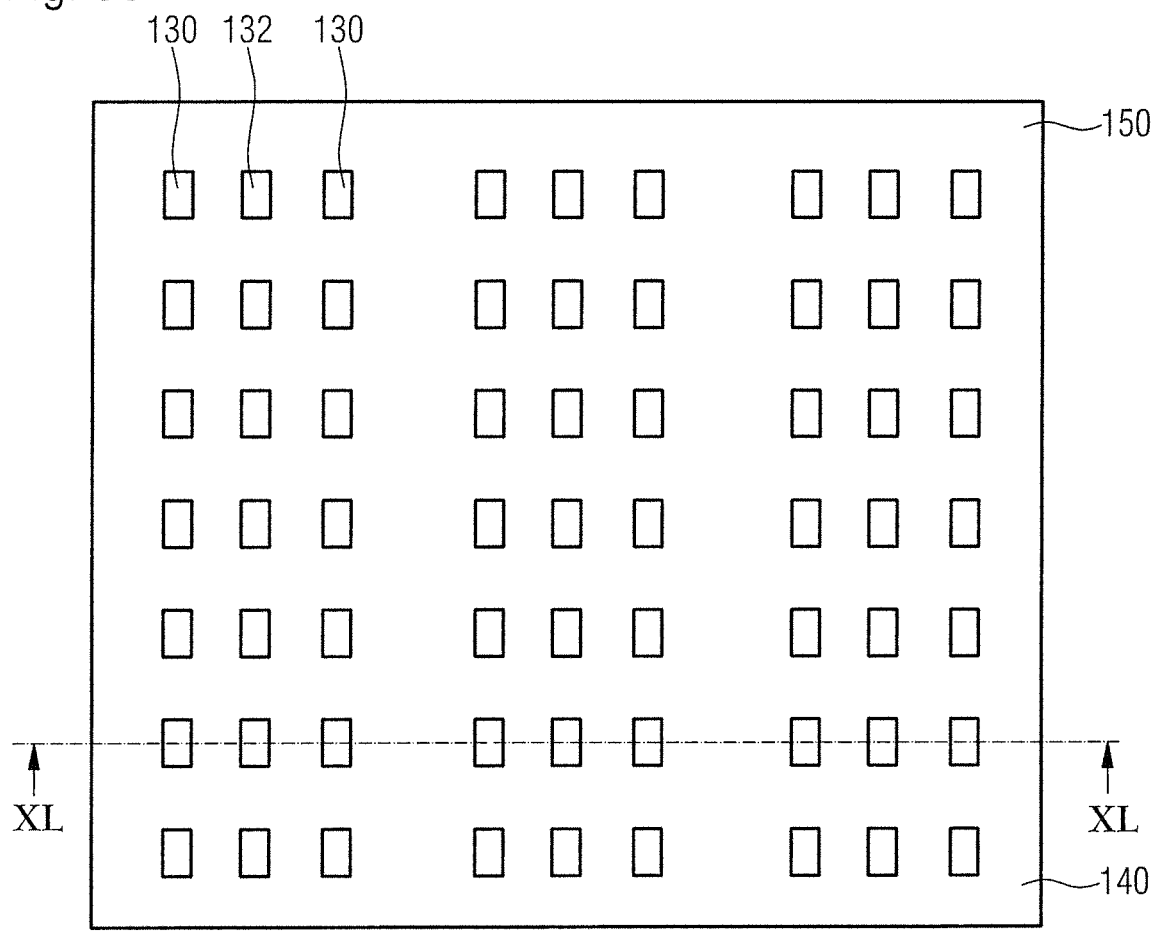
Figure 40:
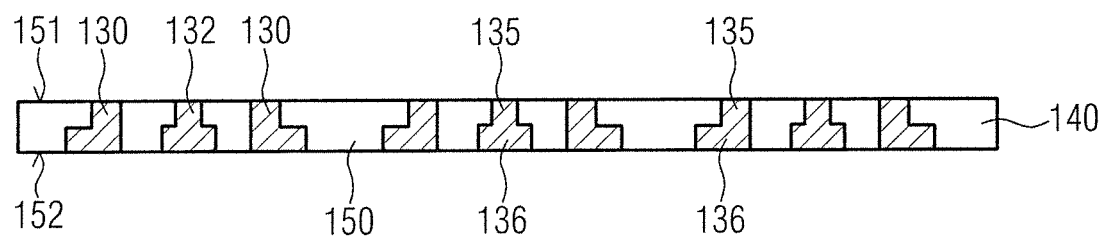

Forming the metallic structure elements 130, 132 is followed by removing the masking layers 120, 121, arranging a reflective embedding material 140 enclosing the structure elements 130, 132 on the auxiliary carrier 110, and removing the auxiliary carrier 110. As a result, as is illustrated in FIGS. 39 and 40, a planar plate-shaped carrier 150 is provided. With regard to arranging the embedding material 140 on the auxiliary carrier 110, the embedding material 140 terminates flush with the structure elements 130, 132 and surfaces of the structure elements 130, 132 facing away from the auxiliary carrier 110 to remain free as a result. If the surfaces of the structure elements 130, 132 should be covered with the embedding material 140 during the process of applying the embedding material 140, in the context of arranging the embedding material 140 and/or thereafter an additional process of exposing the surfaces may be carried out (respectively not illustrated).

The carrier 150, as shown in FIGS. 39 and 40, comprises two opposite planar main sides 151, 152 formed by the metallic structure elements 130, 132 and the reflective embedding material 140. The structure elements 130, 132 extend from one main side 151 to the other main side 152 and are freely accessible at the two main sides 151, 152. The first sections 135 of the structure elements 130, 132 comprising the smaller lateral dimensions are situated at the main side 151, and the second sections 136 of the structure elements 130, 132 comprising the larger lateral dimensions are situated at the other main side 152 of the carrier 150. The main side 151 may comprise a relatively small or minimal proportion of metal as a result.

Figure 41:
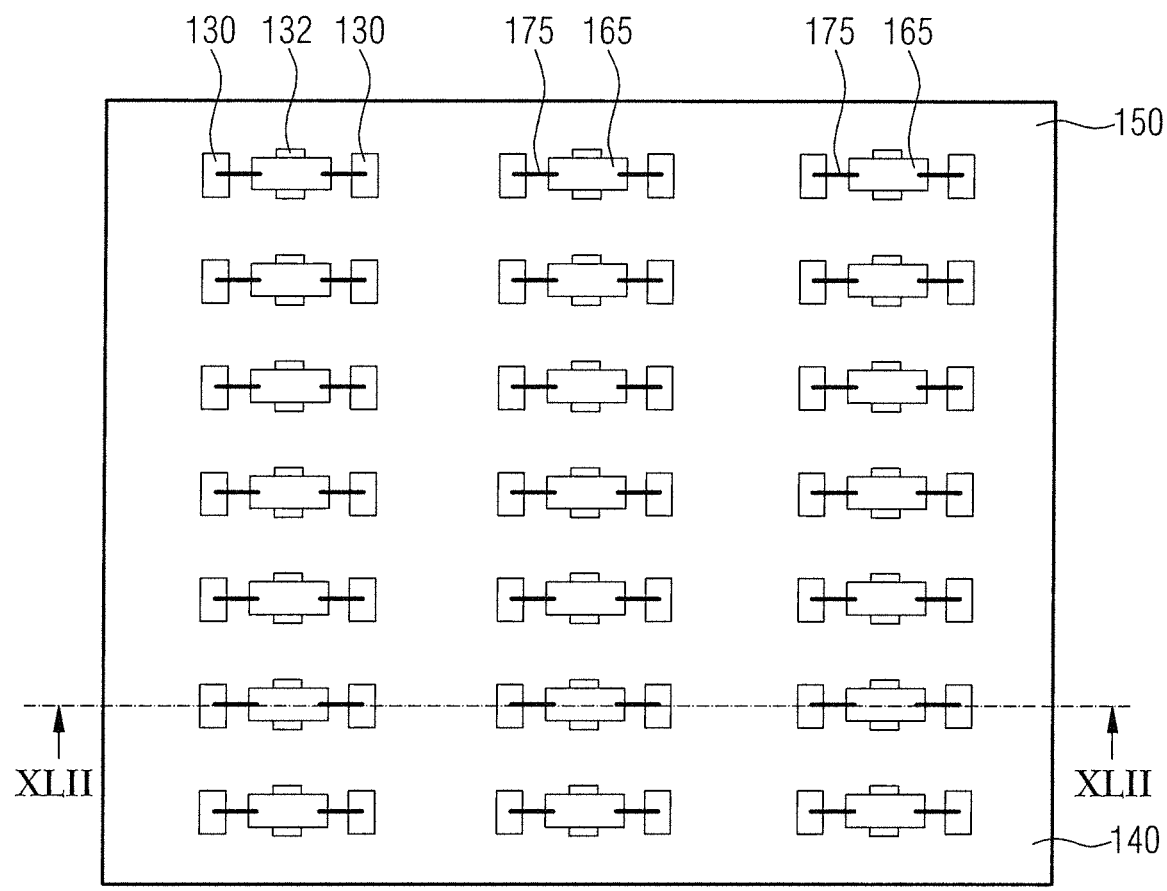
Figure 42:
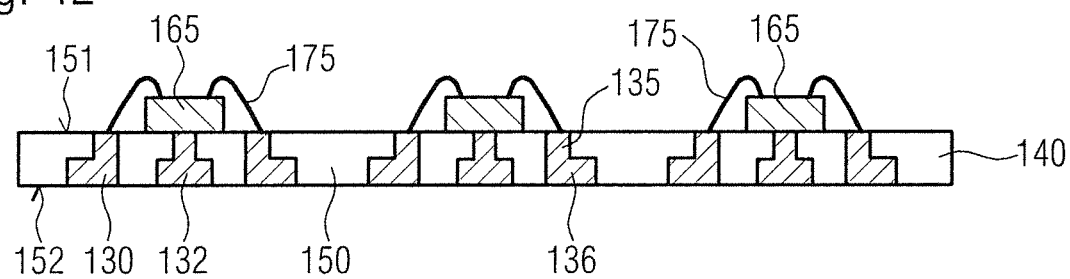

Afterward, as shown in FIGS. 41 and 42, radiation-emitting semiconductor chips 165 are arranged on the main side 151 of the carrier 150. In this case, the semiconductor chips 165 are positioned on the structure elements 132 provided for heat dissipation. This process may be carried out, for example, by adhesive bonding or soldering of the semiconductor chips 165. Furthermore, the semiconductor chips 165, as indicated below, electrically connect to the structure elements 130 situated laterally with respect to the structure elements 132.

The radiation-emitting semiconductor chips 165 are light emitting diode chips (LED chips) comprising front-side contacts (not illustrated). As is shown in FIGS. 41 and 42, the front-side contacts of the semiconductor chips 165 electrically connect to the structure elements 130 of the carrier 150 via contact structures in the form of bond wires 175 after the process of arranging the semiconductor chips 165 on the carrier 150.

The radiation-emitting semiconductor chips 165 are also volume emitters that, during operation, may emit a light radiation via a front side, directed upward in FIG. 42, and via lateral sidewalls. This primary light radiation may once again be a blue or ultraviolet light radiation. Furthermore, the semiconductor chips 165 comprise further constituents (not illustrated) such as a radiation-transmissive chip substrate comprising sapphire, for example, and a semiconductor layer sequence arranged thereon and comprising an active zone that generates radiation. The chip substrate may form the rear side and the sidewalls or a significant portion of the sidewalls of a semiconductor chip 165. The semiconductor layer sequence, on which the contacts may be provided, may be situated on the front side of the chip substrate.

Figure 43:
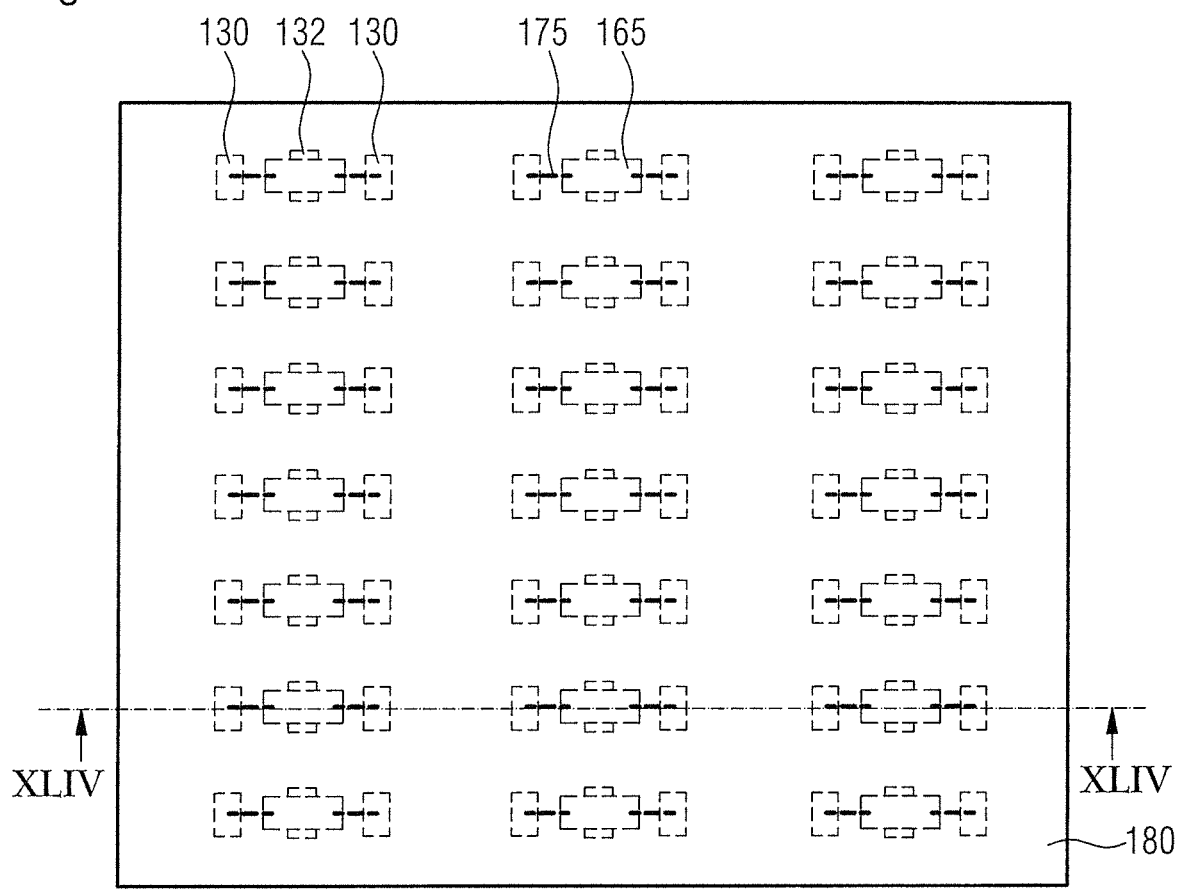
Figure 44:
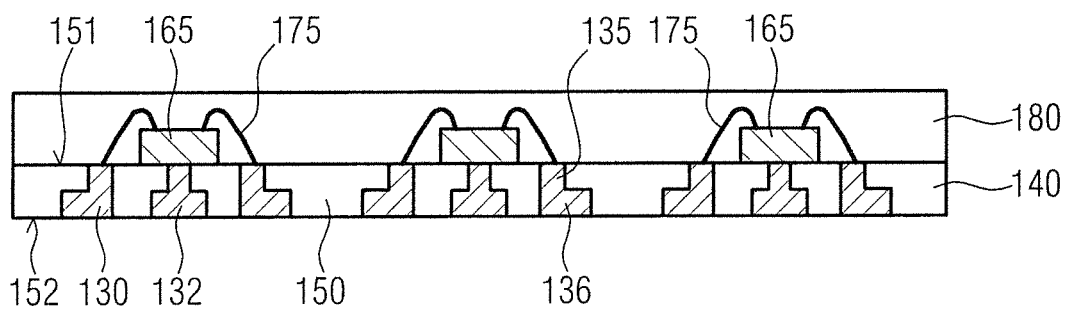

Afterward, as shown in FIGS. 43 and 44, a conversion material 180 for radiation conversion is arranged on the main side 151 of the carrier 150 that is provided with the radiation-emitting semiconductor chips 165. The conversion material 180 is applied in the form of a continuous layer completely covering the semiconductor chips 165 and bond wires 175.

Figure 45:
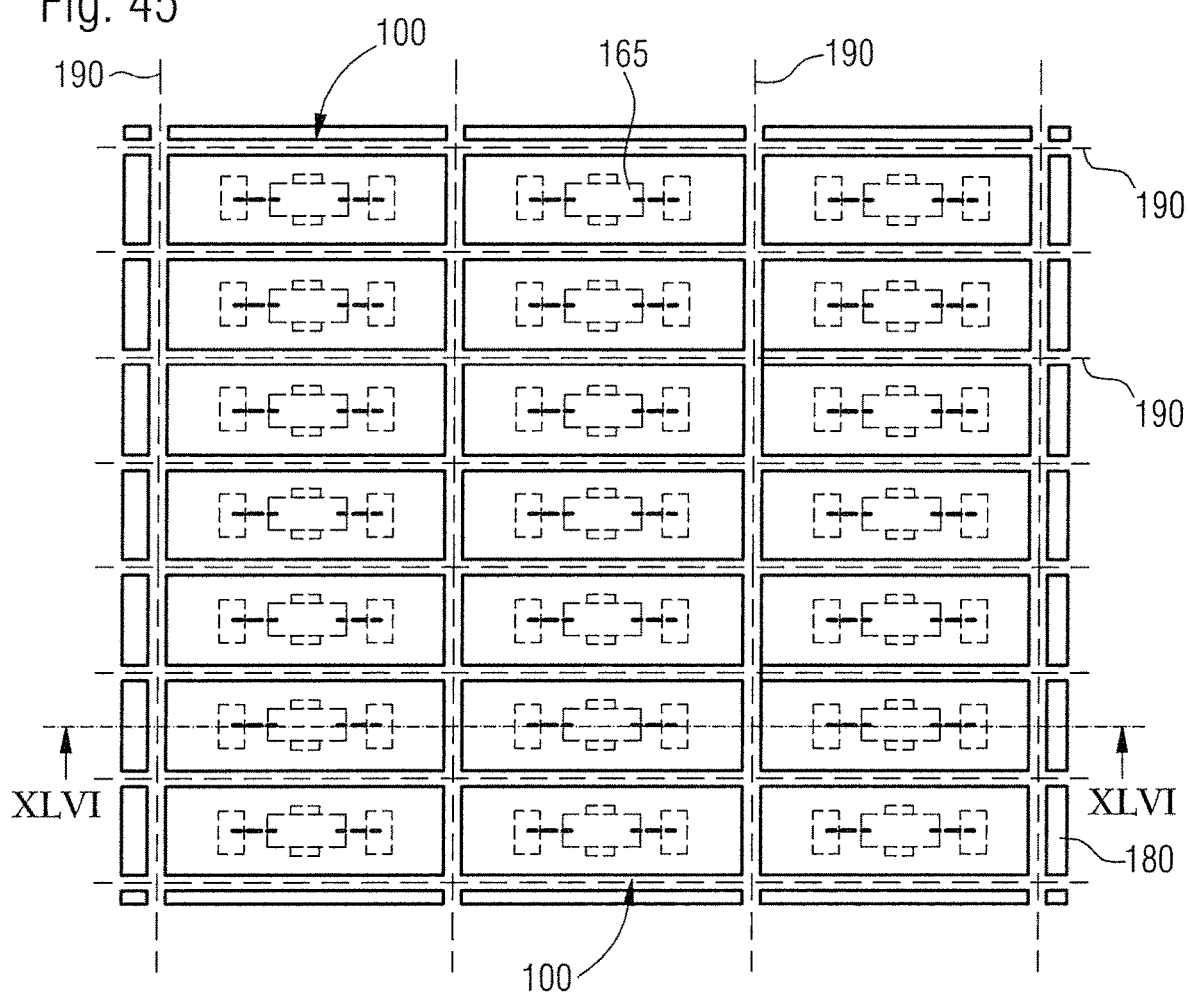
Figure 46:
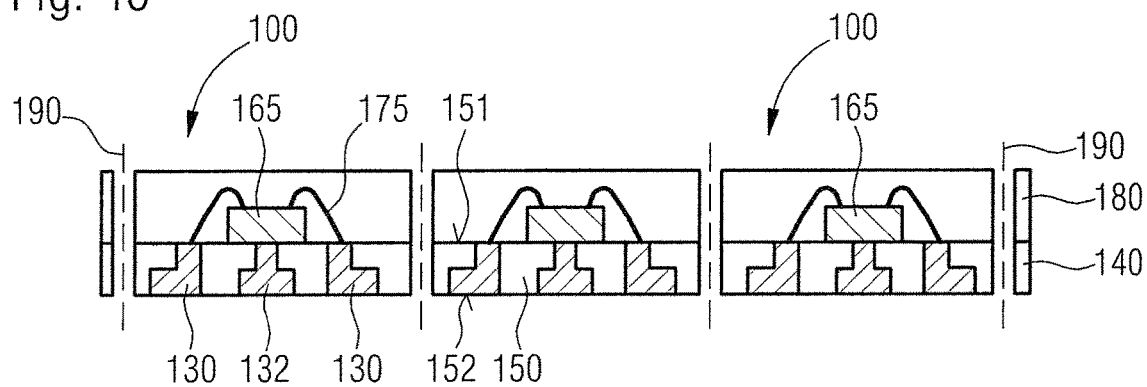

Afterward, as shown in FIGS. 45 and 46, the component assemblage then present is singulated into separate radiation-emitting components 100. This process involves severing the reflective embedding material 140 of the carrier 150 and the conversion material 180 along separating lines 190 indicated in a dashed manner in FIGS. 45 and 46. The components 100 formed as a result each comprise a severed section of the carrier 150 with two metallic structure elements 130 serving as electrical conductor structures, and with one metallic structure element 132 serving for heat dissipation, and a radiation-emitting semiconductor chip 165 arranged thereon and enclosed by the conversion material 180. The semiconductor chips 165 of the components 100 may be electrically driven via the structure elements 130.

The components 100 shown in FIGS. 45 and 46 are likewise suitable for surface mounting. In this case, those surfaces of the metallic structure elements 130, 132 exposed at the main side 152 of the carrier 150 may be utilized as connection pads to connect the components 100 to a further device (not illustrated).

The method sequence explained with reference to FIGS. 35 to 46 and the radiation-emitting components 100 produced thereby may be distinguished by the same advantages as have been explained above. In this regard, the main side 151 of the carrier 150 may comprise a relatively small or minimal metal surface and be highly reflective as a result. The structure elements 130 of the carrier 150 provided in the method are separated from one another and thus not short-circuited, which makes it possible still to carry out electrical test measurements before singulation.

The method explained with reference to FIGS. 35 to 46 may be correspondingly modified such that multi-chip components comprising a plurality of radiation-emitting semiconductor chips 165 are produced. This may be realized, for example, by the component assemblage shown in FIGS. 43 and 44 being singulated into components comprising a plurality of semiconductor chips 165, in a departure from FIGS. 45 and 46. In the components produced in this way, the semiconductor chips 165 are electrically isolated from one another and may therefore be electrically driven separately from one another (not illustrated).

A modification of the method to the effect that multi-chip components comprising a plurality of radiation-emitting semiconductor chips 165 electrically connected to one another are fabricated is also possible. Such configurations may be realized with the aid of a carrier 150 coordinated therewith, which comprises metallic structure elements electrically connected to one another via metallic material or connection webs (not illustrated).

Figure 47:
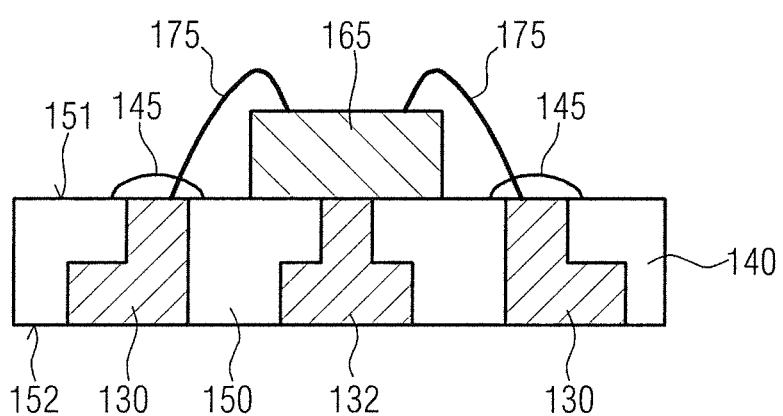
FIG. 47 schematically shows an enlarged illustration of a carrier with reflective layers applied thereon, via which metallic structure elements of the carrier are covered.

A further method variant is shown as an excerpt in the enlarged lateral sectional illustration in FIG. 47. In this case, the metallic structure elements 130 of the carrier 150 that serve as conductor structures are covered in each case with an additional reflective layer 145 after the process of forming the bond wire connections and before the process of applying the conversion material 180. The high reflectivity of the carrier 150 may be improved further in this way. The layers 145 may be realized from the same material employed for the reflective embedding material 140 during the process of providing the carrier 150.

Besides the examples depicted and described above, further examples are possible that may comprise further modifications and/or combinations of features. It is possible, for example, to use other materials instead of the materials indicated above.

Further possible modifications consist of forming carriers comprising configurations and shapes of metallic structure elements which deviate from the figures. This may be realized with the aid of correspondingly formed masking layers.

Furthermore, it is possible to use only one masking layer and/or to carry out only one metal deposition process for forming metallic structure elements on an auxiliary carrier.

Moreover, it is possible to carry out one or more electroless chemical deposition processes to form metallic structure elements. A combination of at least one galvanic and at least one electroless chemical metal deposition process is also possible.

Furthermore, the possibility is afforded of arranging a conversion material for radiation conversion not in the form of a continuous layer but instead in the form of separate layer sections on a carrier provided with radiation-emitting semiconductor chips. In each case individual or a plurality of semiconductor chips may be enclosed by such a layer section. In this variant, just the reflective embedding material of the carrier may be severed during singulation (not illustrated).

Although our components and methods have been more specifically illustrated and described in detail by preferred examples, nevertheless this disclosure is not restricted by the examples disclosed and other variations may be derived therefrom by those skilled in the art, without departing from the scope of protection of the appended claims.

This application claims priority of DE 10 2017 105 017.5, the subject matter of which is incorporated herein by reference.

The invention claimed is:

1. A method of producing radiation-emitting components comprising:
   providing a metallic auxiliary carrier;
   forming metallic structure elements on the auxiliary carrier by carrying out at least one metal deposition process with the aid of at least one masking layer;
   arranging a reflective embedding material enclosing the metallic structure elements on the auxiliary carrier and removing the auxiliary carrier such that a carrier comprising the structure elements and the embedding material and comprising two opposite main sides is provided, wherein the main sides of the carrier are formed by the structure elements and the embedding material;
   arranging radiation-emitting semiconductor chips on the carrier after providing the carrier;
   arranging a conversion material for radiation conversion on the carrier provided with the semiconductor chips; and
   carrying out a singulation process of forming separate radiation-emitting components.

2. The method according to claim 1, wherein metallic structure elements are formed in which at a beginning and at an end of the forming a noble metal and therebetween at least one further metal are deposited.

3. The method according to claim 1, wherein metallic structure elements comprising a first and a second section are framed, the first sections of the structure elements comprise smaller lateral dimensions than the second sections of the structure elements, the first sections of the structure elements are situated at one main side and the second sections of the structure elements are situated at another main side of the carrier provided, and the semiconductor chips are arranged on that main side of the carrier at which the first sections of the structure elements are situated.

4. The method according to claim 1, wherein metallic structure elements are formed that are connected to one another via metallic material.

5. The method according to claim 4, wherein radiation-emitting components are formed that comprise a plurality of radiation-emitting semiconductor chips, and the plurality of semiconductor chips of the radiation-emitting components electrically interconnect via the connected metallic structure elements.

6. The method according to claim 5, wherein arranging the radiation-emitting semiconductor chips is carried out on one of the two main sides of the carrier, the connected metallic structure elements are accessible only at that main side of the carrier on which the semiconductor chips are arranged, and the connected metallic structure elements connect via connection webs completely embedded in the reflective embedding material.

7. The method according to claim 1, wherein the radiation-emitting semiconductor chips are volume emitting semiconductor chips.

8. The method according to claim 1, wherein the radiation-emitting semiconductor chips comprise rear-side contacts, and the rear-side contacts of the semiconductor chips are electrically connected to metallic structure elements of the carrier using an electrically conductive connection material.

9. The method according to claim 1, wherein the radiation-emitting semiconductor chips comprise front-side contacts, and contact structures are formed via which the front-side contacts of the semiconductor chips and metallic structure elements of the carrier electrically connect to one another.

10. The method according to claim 1, wherein metallic structure elements of the carrier are covered with an additional reflective layer.

11. The method according to claim 10, wherein the reflective layer is formed from the reflective embedding material of the carrier, and the reflective embedding material comprises a radiation-transmissive basic material and reflective particles embedded therein.

12. The method according to claim 1, wherein metallic structure elements provided for heat dissipation in the radiation-emitting components are formed, and the semiconductor chips are arranged on the structure elements provided for heat dissipation.

13. The method according to claim 1, wherein the at least one metal deposition process carried out to form the metallic structure elements is a galvanic metal deposition process.

* * * * *